United States Patent [19]

Shapiro et al.

[11] Patent Number: 5,257,363
[45] Date of Patent: Oct. 26, 1993

[54] COMPUTER-AIDED GENERATION OF PROGRAMS MODELLING COMPLEX SYSTEMS USING COLORED PETRI NETS

[75] Inventors: Robert M. Shapiro, Cambridge; Jawahar Malhotra, Waltham, both of Mass.; Kurt Jensen, Hojbjerg; Soren Christensen, Arhus, both of Denmark; Peter Huber, Cambridge, Mass.

[73] Assignee: Meta Software Corporation, Cambridge, Mass.

[21] Appl. No.: 507,119

[22] Filed: Apr. 9, 1990

[51] Int. Cl.$^5$ ............................................. G06F 15/20
[52] U.S. Cl. .................................... 395/500; 364/188; 364/191; 364/976.5; 364/DIG. 2
[58] Field of Search ............... 395/500, 800, 100, 120, 395/140; 364/188, 191

[56] References Cited

U.S. PATENT DOCUMENTS

| | | | |
|---|---|---|---|
| 4,455,619 | 6/1984 | Masui et al. | 395/160 |
| 4,677,587 | 6/1987 | Zemany, Jr. | 395/500 |
| 4,710,863 | 12/1987 | Kaufmann et al. | 364/146 |
| 4,736,320 | 4/1988 | Bristol | 364/300 |
| 4,827,404 | 5/1989 | Barstow et al. | 395/500 |
| 4,831,580 | 5/1989 | Yamada | 395/133 |
| 4,866,605 | 9/1989 | Nakano et al. | 395/500 |
| 4,866,663 | 9/1989 | Griffin | 395/500 |
| 4,972,334 | 11/1990 | Yamabe et al. | 395/500 |
| 5,029,080 | 7/1991 | Otsuki | 395/375 |
| 5,127,104 | 6/1992 | Dennis | 395/650 |
| 5,187,788 | 2/1993 | Marmelstein | 395/700 |

FOREIGN PATENT DOCUMENTS 0160944 11/1985 European Pat. Off. .

OTHER PUBLICATIONS

Jensen, Kurt, "Coloured Petri Nets; A Way to Describe and Analyse Real-World Systems without Drowning in Unnecessary Details", Conf. on Sys. Engineering, Sep. 9-11, 1987.
Kyratzoglou, I. M., "Computer Aided Petri Net Design for decision-making organizations", Proceedings of the 1988 Winter Simulation Conference.
Moreno, C. Sanchez, "Galileo: Model, Language, and Tools", Electrical Communication, 1986, Nos. 3-4, Harlow, Essex, Great Britain.

*Primary Examiner*—Robert B. Harrell
*Assistant Examiner*—Alpesh M. Shah
*Attorney, Agent, or Firm*—Wolf, Greenfield & Sacks

[57] ABSTRACT

A method and system in which a programmed digital computer serving as a graphical "engine" is employed to construct an executable model for a complex system using a hierarchy of so called "Colored" Petri nets (CPN's or CP-nets). The operation of the complex system is specified in terms of a graphical net structure and formal net inscriptions, such as arc expressions and guards, which ensure development of a program, or executable model, and associated data structures, properly defining the system. Sophisticated syntax checks and other tools are provided for ensuring that the model so constructed conforms to a set of rules which guarantee valid system behavior.

2 Claims, 24 Drawing Sheets

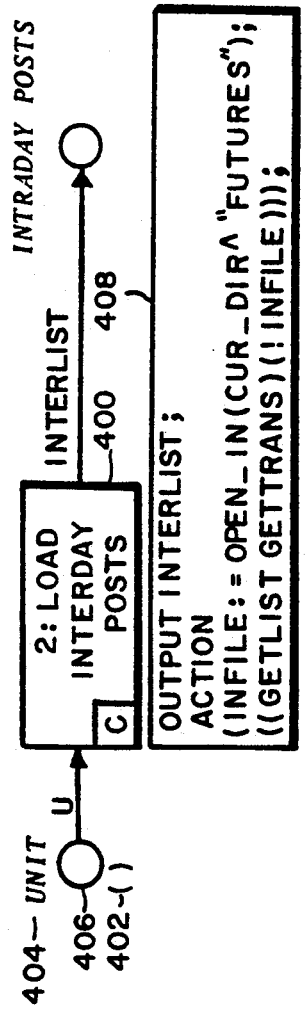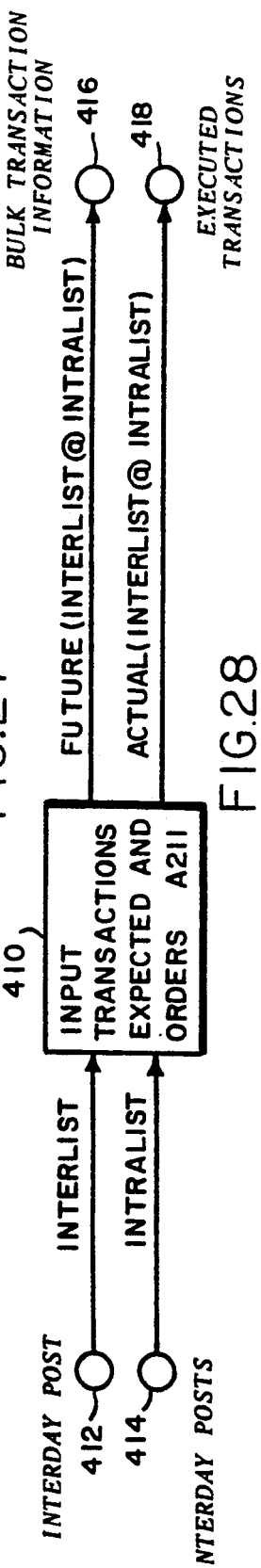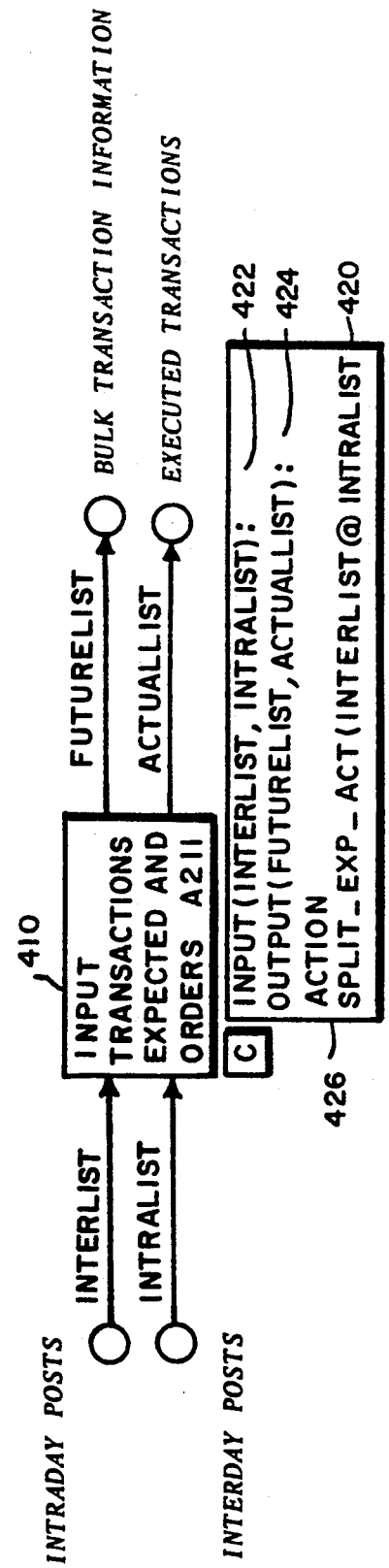
FIG.27
FIG.28
FIG.29

COMPUTER-AIDED GENERATION OF PROGRAMS MODELLING COMPLEX SYSTEMS USING COLORED PETRI NETS

FIELD OF THE INVENTION

This invention relates to a method and apparatus for creating graphical models of complex systems (i.e., computer programs representing such systems), for checking those models for certain properties, and for executing those models to simulate such systems and control their operation. More particularly, the invention relates to a system for developing those models using a hierarchical arrangement of so-called "Colored" Petri Nets.

BACKGROUND OF THE INVENTION

Complex systems are all around us, including such examples as highway and air traffic systems; telephone networks; financial and banking systems; systems for the manufacture, distribution and sale of retail goods; legal systems; computer systems of various types; information transmission networks; and many more. In large part, these systems are characterized by concurrency (i.e., a number of actions may be occurring at the same time) and by asynchronicity (i.e., there is no master clock controlling the timing of events; many events can occur independently of one another). The development, modification and management of such systems is a very expensive, time-consuming and difficult task. Because of these and other factors, considerable efforts have been devoted over recent years to developing ways to analyze, simulate and (in some cases) control such systems. For example, one would like to be able to know, analytically, whether a change proposed for the structure or control programs for the long-distance telephone network is safe, or if it will cause the system to become deadlocked under some set of circumstances; it is undesirable to simply wait to see if something disastrous is going to happen.

Computer-graphical methods are being used more and more frequently in the specification and design of complex systems. The resulting models provide a basis for validating the design concepts, because they can be understood both by the designer and by the user, and because they can be scrutinized to determine whether the user's requirements have been satisfied. The model can then be used as a guide to, or vehicle for, the implementation or control of the actual physical system. For example, a computer program implementing the model can be used to control the system operation. The system might, thus, be a telephone switching network and the program might operate the digital controller which, in turn, operates the switches. Or the system might be a subway traffic control system and the program might operate signal lights, dispatch scheduling, and so forth.

Executable models of complex systems (i.e., computer programs which model these systems) are now being introduced into practice. In general, they may be classified into two categories: (1) models based on an underlying mathematical framework and (2) models based on an ad hoc graphical representation tied to conventional programming languages. Both types of models can be executed and, in that sense, can be thought of as programs. Models of the first type, moreover, can be analyzed according to certain rules, to discover whether the system possesses certain behavioral properties. These properties include deadlock, safety, and some forms of invariance. Performance analysis is also possible in some cases.

Few, if any, techniques exist for effectively marrying the two categories of executable models. Thus, one does not readily obtain a model which is both graphically represented or constructed and which is also analyzable. One graphical approach which has been developed for modelling and simulating systems exhibiting concurrency and asynchronicity is that of Petri nets. One reason Petri net representations are used is that they are also somewhat analyzable. A good discussion of the history and general principles of Petri nets is contained in T. Murata, "Petri Nets: Properties, Analysis and Applications," *Proceedings of the IEEE*, Vol. 77, No. 4, April 1989 (New York) at 541–580, and T. Agerwala, "Putting Petri Nets to Work," *Computer*, Vol. 12, No. 12, Dec. 1979, at 85–94, both of which are hereby incorporated by reference. Though Petri nets have been very useful for modelling systems graphically and mathematically, and though theoretically they are useful for system analysis, as well, it has been found that there is a tradeoff between modeling generality and analysis capability. That is, the more general the model represented by the Petri net, the less amenable it is to analysis. Indeed, it has been said that the complexity problem is a major weakness of Petri nets; that is, Petri-net-based models become too large for analysis even for a modest size system. Moreover, Petri net models and models based on other such paradigms typically are not analyzable, though they are developed on sophisticated computer systems. Thus, they do not address details of behavior of the complex system which they model. In other words, they do not reveal properties of the modelled system, they only simulate it. Validation that the system behaves as desired occurs only by observing the actual operation of the system. Consequently, serious design flaws and performance limitations may not be discovered until the system is in use. Correction of these conditions can be very costly and time-consuming, to say the least. At least one hardware system has been proposed for implementing Petri net models. See U.S. Pat. No. 4,700,187, titled Programmable, Asynchronous Logic Cell and Array, issued Oct. 13, 1987 in the name of Frederick C. Furtek. Though this system permits simulation of Petri nets as, essentially, executable models, it still does not analyze system properties.

Accordingly, it is an object of the invention to provide an improved method for modelling complex systems.

It is another object to provide a method for generating executable models of complex systems.

Still another object of the invention is to provide a method for generating executable models of large complex systems from simpler models of parts of the system, i.e., subsystems.

Yet another object of the invention is to generate models of complex systems which are analyzable, to permit detection of predetermined system behaviors or properties.

A further object of the invention is to provide a method for graphically constructing executable models of systems, which are also analyzable.

SUMMARY OF THE INVENTION

The foregoing and other objects as will hereinafter appear are achieved in a method and system in which a programmed digital computer serving as a graphical "engine" is employed to construct an executable model for a complex system using a hierarchy of so-called "Colored" Petri nets (CPN's or CP-nets). The operation of the complex system is specified in terms of a graphical net structure and formal net inscriptions, such as arc expressions and guards, which ensure development of a program, or executable model, and associated data structures, properly defining the system. Sophisticated syntax checks and other tools are provided for ensuring that the model so constructed conforms to a set of rules which guarantee valid system behavior.

Using a (preferably) graphical programming tool such as Design/CPN (available from Meta Software Corporation of Cambridge, Mass.) running on a suitable digital computer system (such as a SUN SPARC workstation from Sun Microsystems, Inc. of Mountain View, Calif., a model of the subject system is created. This model is built from a plurality of Colored Petri nets (CPN's or CP-nets) constituting submodels of parts of the system, the submodels being interrelated in a hierarchical fashion. Each of the individual submodel CPN's is assembled from places, transitions, arcs, arc inscriptions, and so forth, represented by appropriate program code. The model, and the constituent submodels, are represented to the modeller on a video display terminal, or the like. The constructed model is actually a data base. Once the model is complete, a syntax check is performed. The syntax check validates the structure of the model, to ensure that all necessary occurrence functions can be generated. If the syntax check fails, indicating the model violates a prescribed rule, the modeller edits the model and again performs a syntax check. Now that the editting phase of the process is complete, the procedure "switches" into a simulation mode, commencing with the compilation of executable program code. Once the compiled code has been generated, it is executed, to simulate the system.

The invention will be more fully understood from the detailed description presented below, which should be read in conjunction with the accompanying drawing.

BRIEF DESCRIPTION OF THE DRAWING

In the drawing,

FIG. 27 is a diagrammatic illustration of an exemplary model a portion of the MID model, in which an output-arc-expression identifies a code segment in which an SML function is applied to input variables;

FIG. 28 is a diagrammatic illustration of a transition which splits two lists of incoming transactions into two lists representing transactions not yet executed and transactions already executed;

FIG. 29 is a diagrammatic illustration of a more efficient transition having the same function as the transition of FIG. 28;

DETAILED DESCRIPTION

Figure 1:
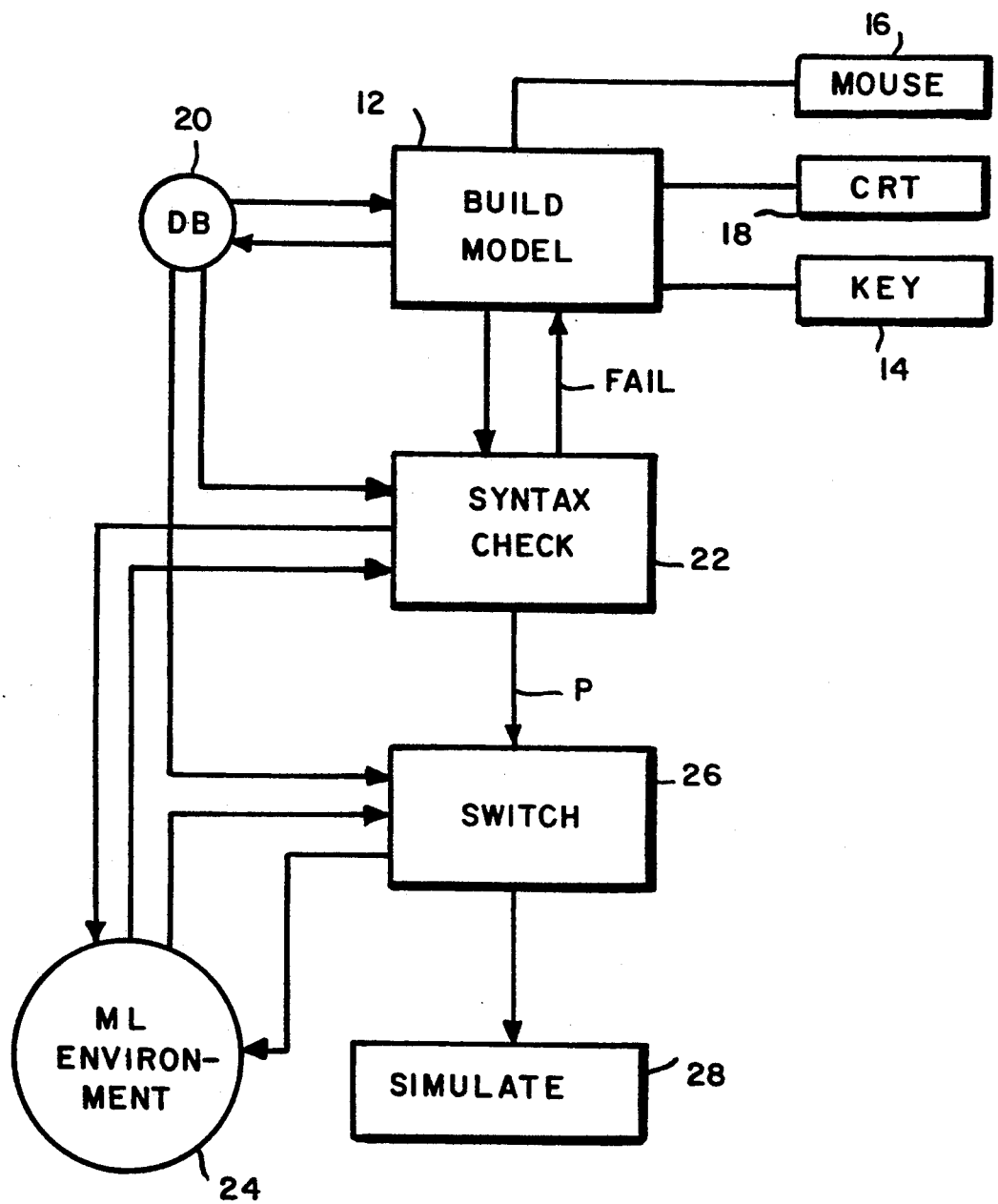
FIG. 1 is a diagrammatic illustration of the generation of an executable model according to the present invention.

An overview of the method 10 for creating an executable model according to the present invention is shown in FIG. 1. Using a (preferably) graphical programming tool such as Design/CPN (available from Meta Software Corporation of Cambridge, Mass.) running on a suitable digital computer system (such as a SUN SPARC workstation from Sun Microsystems, Inc. of Mountain View, Calif., a model of the subject system is created. Step 12. For input devices, a keyboard 14, mouse 16 or similar devices may be emmployed. This model is built from a plurality of Colored Petri nets constituting submodels of parts of the system, the submodels being interrelated in a hierarchical fashion. Each of the individual submodel CPN's is assembled from places, transitions, arcs, arc inscriptions, and so forth, represented by suitable computer program code. The model, and the constituent submodels, are represented to the modeller on a video display terminal, 18, or the like. The constructed model is actually a data base 20. Once the model is complete, a syntax check is performed. Step 22. The syntax check validates the structure of the model, to ensure that all necessary occurrence functions can be generated. If the syntax check fails, indicating the model violates a prescribed rule, the modeller edits the model using the tools and procedures of step 12, and again performs a syntax check. Once the syntax check passes, or succeeds, color set definitions are passed to another data structure 24. Now that the editing phase of the process is complete, the procedure "switches" in step 26 into a simulation mode, commencing with the compilation of executable program code. The executable code may be written in any of a number of programming languages, but we have found ML to be particularly useful. ML originated at the University of Edinburgh, Scotland. A commercial version of an ML compiler is available from Bell Telephone Laboratories or from Meta Software Corporation. When ML is employed, the data structure 24 may be the ML "environment." Once the compiled code has been generated, it is executed, to simulate the system. Step 28.

We have found the C programming language useful for the graphical programming engine. The graphical programming engine may be executed on the same processor as the compiled program code, or they may be executed on different processors.

In describing the invention, its basic concepts and operations will first be explained in the context of a simple (i.e., "flat") system model. Once that foundation has been provided, it will be shown how the invention applies to more complex systems and how models of complex systems are created using the invention. An example is discussed wherein the invention has been applied to modelling and operating a banking system.

Figure 2:
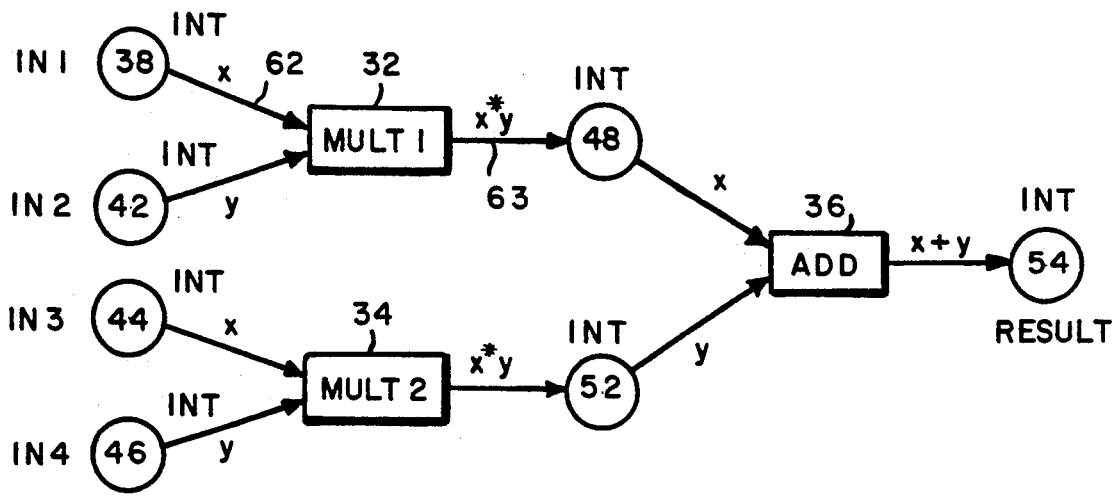
FIG. 2 is a diagrammatic illustration of a simple example of a non-hierarchical Petri net model of a system.

Referring now to FIG. 2, a simple example is shown of a "flat" (i.e., non-hierarchical) Petri net model of a system. (Such a simple system may, for example, be a subsystem of a more complex system. The nature of the system is unimportant; it might equally well be a system for manufacturing pharmaceuticals, a system for controlling elevators in a high-rise building or almost any other kind of system). Such a flat model is a dataflow representation of a computational process. In another, more formal sense, it is a bipartite directed graph, with the vertex set partitioned into two sets. These sets are referred to as "transitions" and "places". They are respectively represented by rectangles, such as rectangles 32, 34 and 36, and by ellipses (or circles), such as circles 38, 42, 44, 46, 48, 52, and 54. This is conventional Petri net notation. The transitions label elements of action; the places denote local states which may be viewed as inputs and outputs of the transitions to which they are directly connected. The orientation of the arc connecting a transition and a place (e.g., arc 62) determines whether the selected place is an input place or an output place of the transition. (A given place may, for example, be an output place for a first transition and an input place for a second transition.)

The method described herein is not limited to this representation, but it is a useful platform to use for purposes of explanation and exemplification. Other representations can be mapped onto this framework, such as graph models with only one vertex type.

A place is analogous to a variable in programming languages, in that it contains structured values. It is different in that it can hold from zero to any number of values, each of which is separately accessible. New values are put in the place by the occurrence of transitions that have the place as an output. Values are removed (i.e., read) from a place by the occurrence of transitions that have the place as an input. Thus the values can be perceived as tokens that "flow" in the model. Indeed, in some Petri net hardware embodiments, tokens may be signal levels, states or the like which actually do propagate from one place to another.

A place has two primary attributes, its "color set" and its "marking." A color set is analogous to a "type" in programming languages and specifies the set of permitted contents for the place. A marking is analogous to a "value" in programming languages. It is a multi-set (i.e., a set whose elements are multiples) which specifies symbolically the set of tokens that reside on the place. Note that the marking has not been illustrated in the FIG. 2 example. The "state" of a flat model is a function mapping each place to its marking.

In the example of FIG. 2, a third attribute is added: the "name" of the place. For example, place 38 has the name "in 1". This name plays no formal role in the model.

A transition is analogous to a set of assignment statements in a conventional programming language, to a function in functional programming languages, and to a rule in a language like PROLOG. It can be viewed as a function which maps places' values to places' values. A transition has associated with it a number of attributes: input places, output places, variables, guards and code segments.

For a given transition, the arcs from its input places to the transition are called the input-arcs of the transition. This in FIG. 2, arc 62 is an input arc of transition 32. The inscriptions on those arcs (e.g., the inscription "x" on arc 62) are called the input-arc-expressions of the transition. Similarly, the arcs from the transition to its output places (e.g., the arc 63) are called the output-arcs of the transition. The inscriptions on the output-arcs (e.g., the inscription "x*y" on arc 63) are called the output-arc-expressions of the transition.

The set of all variables associated with a transition T is written as V(T), and is the set of variables which appear in its input and/or output arc-expressions. In FIG. 2, V(32)={x,y}, where the braces are used for conventional set notation. The set of all input variables, IV(T) is the set of variables which appear on the input arcs; analogously for OV(T). Hence V(T) is the union of IV(T) and OV(T). All variables a in V(T) such that a are not in IV(T) are known as "free variables". Some variables may appear only in output-arc-expressions; such a free variable can assume any value from its color set. The scope of all variables in V(T) is local to the transition T. The only thing a transition depends on is the marking of all its input places and the only thing it affects is the marking of all its input and output places. A list of Boolean expressions which constrain the possible combination of values assumed by the variables in V(T) is known as a "guard."

A program fragment to be executed each time the transition T occurs is called a "code segment." The variables in IV(T) may be used as inputs for a code segment. The variables in OV(T) may be assigned values as outputs. Reference variables mentioned in other code segments, but not otherwise in the model may be used as values or assigned new values.

Simulating a Flat Model

Given a flat model in a first state $S_1$, consider now how it changes to a second state $S_2$. The state is a mapping from each place to its corresponding marking. Consequently, the model can change from state $S_1$ to state $S_2$ only by the occurrence of one or more of its transitions.

Binding

In contrast with the prior art, transitions are not allowed to occur freely. Rather, in order for a transition to occur, a "binding" must first be determined for it. A binding for a transition T is a function which assigns to each of the transition's variables to a concrete value. Once a binding is determined, the arc-expressions of the transition are evaluated. This evaluation determines the tokens to be removed from the transition's input places upon the occurrence of the transition, and the tokens to he added to its output places.

A transition is said to be "enabled" if there exists a binding such that the input places contain sufficient tokens to satisfy the binding.

Before illustrating how a binding is determined, examine first how, given a binding $B_T$ for a transition T, the occurrence of transition T changes the state of the model. Consider the simple example of FIG. 3, which is a portion of FIG. 2. In this example, the marking at each input place 52 (arg1), 54(arg2) is depicted by an inscription contained within the place. Note that places arg1 and arg2 each contain a single token of type int (i.e., integer). This is a simplification of the general case; in general, the marking at each place is a multi-set which will be represented as a list of values.

Assume the possible binding $B_{add}$ is given, or known, such that $B_{add}(x)=3$ and $B_{add}(y)=4$. Let $B'_{add}$ be the extension of $B_{add}$ to arc-expressions. As a result of the occurrence of transition 36 (add), the model changes state from $S_1$ to $S_2$. $S_2=S_1$ at all places except as follows:

1) For each input place P, $B'_{add}$ is applied to the corresponding input-arc-expression and the resulting expression is evaluated to yield a multi-set value $mv_P$. Now $S_2(P)=S_1(P)-mv_P$. (Note that + and − are used to represent multi-set addition and subtraction respectively.) This is commonly known as "removing token(s) with value $mv_P$ from place P".

The transition add (36) has two input places, arg1 (48) and arg2 (52) with arc-expressions x and y respectively. Applying $B'_{add}$ to x yields 3; applying $B'_{add}$ to y yields 4. Hence $S_2(arg1)=\{\}$ and $S_2(arg2)=\{\}$. No restriction has been placed on the number of tokens in a multi-set. A place may contain more than one token and an arc-expression may evaluate to a multi-set with from zero to an arbitrary number of tokens.

2) For each output place P, $B'_{add}$ is applied to the corresponding output-arc-expression and the resulting expression is evaluated to yield a multi-set value $mv_P$. Now $S_2(P)=S_1(P)+mv_P$. This is commonly known as "adding token(s) with value $mv_P$ to place P". The transition add (36) has only one output place, result (54), with an output-arc-expression x+y on arc 56. Applying $B'_{add}$ to x+y yields the result 7. Thus $S_2(result)=S_1(result)+7=\{\}+7=\{7\}$. Note that if $S_1(result)$ initially had something in it, such as the value 12, then $S_2(result)=\{7,12\}$.

Figure 3:
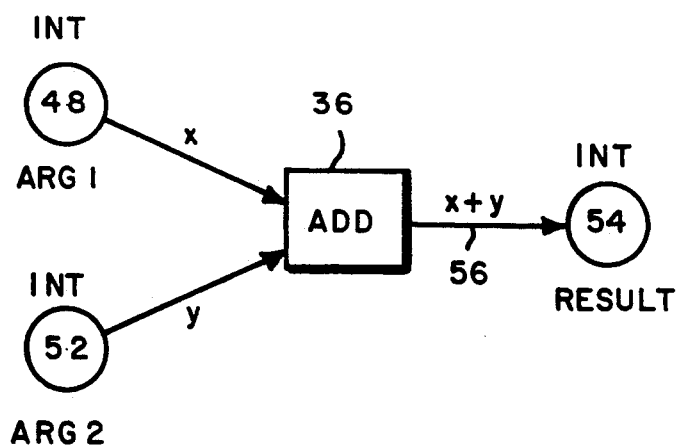
FIG. 3 is an illustration of a portion of the net of FIG. 2.

In the example of FIG. 3, there is only one enabled binding possible. Had the input places contained more tokens, additional bindings would be possible.

Consider now how a binding can be determined. For the moment, ignore guards. Assume that there is only one arc between an input place and a transition. The only requirement of a binding function $B_T$ is that for every input-arc-expression iexp and corresponding input place marking im of T, the value of $B'_T(iexp)$ be a multi-set value mv such that im contains mv.

It is possible for a transition to have more than one enabled binding. The goal of the binding process is to find one or all such bindings. The number of bindings can increase in direct proportion to the product of the number of tokens at each input place. (This is not the case if the same variable is used in more than one input-arc-expression or also occurs in the guard.) If more than one binding is legal, it still has to be determined whether more than one binding can be executed concurrently, i.e., in a single step. This will be discussed below.

The process of finding a binding is a computationally intensive task as it involves traversing potentially large search trees and performing unification (i.e., finding multi-set unions) at each node.

Compiling Transitions

One task in the overall process of generating an executable model (i.e., a program representing the model of the system) is to translate each transition in the system into a single function. This function is called the transition's "occurrence-function." Conceptually, each transition T is characterized as a function which maps a labeled record of multi-sets having a component for each input place into a labeled record of multi-sets having a component for each surrounding place. For example, the transition add can be represented by an occurrence function of the following type:

add :{arg1: int ms, arg2: int ms}→{arg1: int ms, arg2: int ms, result: int ms}, where "ms" signifies a multi-set.

The add function can be used to determine if the add transition can occur, and if so, to calculate the new markings of its adjacent places as a result of the occurrence. Assume that the markings of arg1, arg2 and result are a1m1, a2m1 and rm1 respectively. If the add transition cannot occur, the application of the add function will fail. However, if the transition can occur, then the application will succeed and the multiset of tokens a1d to be removed from arg1 will be calculated, the multiset of tokens a2d to be removed from arg2 will be calculated and the multiset of tokens rd to be added to result will be calculated. As a consequence of the occurrence of the add transition, the new markings of arg1, arg2 and result will be, respectively:

a1m1−a1d, a2m1−a2d, and rm1+rd.

Pragmatically, such an occurrence function must encode all of the transition's arc-expressions and is, as a result, quite complex. Hence, a "layered approach" is taken herein in order to build such an occurrence function. For each transition there are defined: (1) a binding type; (2) for each input place associated with the transition, an input arc function; (3) for each output place, an output arc function; and (4) a function to calculate bindings for the transition.

Defining a Transition's Binding Type

Conceptually, a binding function for transition T is a function on V(T). In practice, representing the binding itself as a labeled record is efficient. For example, bindings for the add transition are values of the following type:

type add'BT = {x:int, y:int} where add'BT should be read as "add Binding Type".

The process for generating binding functions is described below.

Defining a Transition's Arc-Functions

Given a binding for a transition, the arc-expressions of a transition are used to calculate the tokens to be removed from the associated input places upon occurrence of the transition and the tokens to be added to the associated output places. This calculation can be performed as a function application if each arc expression is cast as a function on the binding type of the transition. For example:

fun arg1_add_AF ({x,y}:add'BT) : int ms = x (*=1'x *)

fun arg2_add_AF ({x,y}:add'BT) : int ms = y (*=1'y *)

fun add_result_AF ({x,y}:add'BT) : int ms = (x+y) (*=1'(x+y) *)

Figure 4:
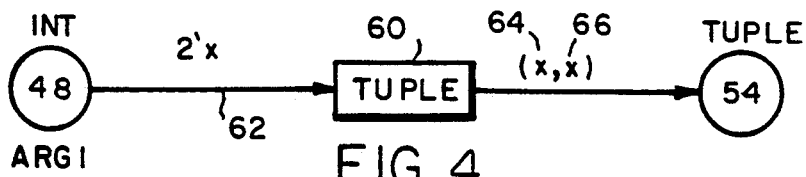
FIG. 4 is a diagrammatic illustration of a transition which removes two identical tokens of color "x" from its input place.
Figure 5:
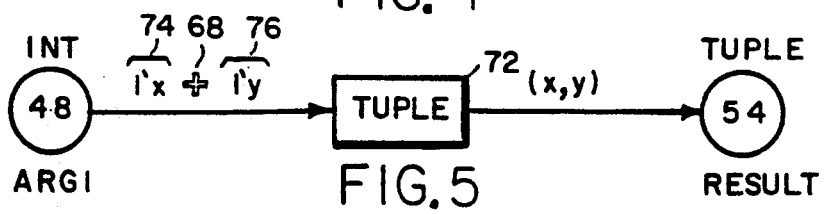
FIG. 5 is a diagrammatic illustration of a transition which removes two tokens, one of color x and one of color y, from its input place.

The "fun" designation denotes a function. The notation "int ms =x" indicates that the resulting value is an integer type multiset in the color x. The backward apostrophe, ', is an infix operator that constructs a multiset containing a given number of occurrences of a given color. As an example, n'x constructs n occurrences of color x. In more detail, the syntax for input arc-expressions requires that an arc-expression evaluate to a multi-set of the same type as is declared for the input place. The prefix '<int>', and multi-set operations, such as multi-set addition, are explicitly allowed. Referring to FIG. 4, the backward apostrophe operator in the expression 2'x on arc 62 permits the removal of two identical tokens of color x from the input place 48 to be represented both graphically and textually as shown there. The tokens to be added to the output place are represented at 64 and 66. The multi-set addition operator 68 on arc 70 permits the removal of two tokens from place 48, one of color x (i.e., 74) and one of color y (i.e., 76), to be represented as shown in FIG. 5.

Figure 6:
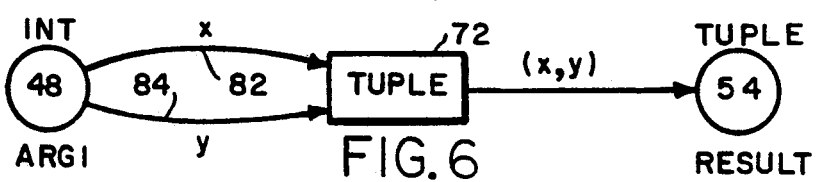
FIG. 6 is an alternative illustration of the net of FIG. 5, showing the decomposition of the input arc into two input arcs.

To simplify the definition of the binding process, input arc-expressions can be decomposed with explicit multi-set addition (or multiple identical tokens) by generating additional input arcs, such as arcs 82 and 84 as illustrated in FIG. 6.

Note that a reference to an input arc function is a reference to the unique (for each input place) function which evaluates to the appropriate multi-set.

Defining an occurrence-function

If the binding for a transition can be calculated with a specific marking for its input places, the occurrence function can be defined in terms of its associated arc functions. The occurrence function applies each of the arc functions to the "value" generated by the binding function to determine the multi-sets to be subtracted from each input place and added to each output place.

Calculating Bindings

The only step now missing for the definition and generation of the occurrence function add is the binding function for add (i.e., Bindadd) which, given a marking for the place arg1 and the place arg2, returns a binding for the transition add.

Bindadd : {arg1 : int ms, arg2 : int ms} → add'BT

The process for determining the functionality of Bindadd is described in terms of search trees. The goal of the function Bindadd is to transform a completely unspecified binding $b_0$ into a completely specified binding $b_n$ such that arg1_add_AF($b_n$) ← #arg1(ipm) and arg2_add_AF($b_n$) ← #arg2(ipm)

where ← denotes the subset operation for the multi-sets and ipm is the argument of Bindadd. #arg1 and #arg2 are selector functions which map the compound marking represented by the record for ipm into the arg1 and arg2 components.

Figure 7A:
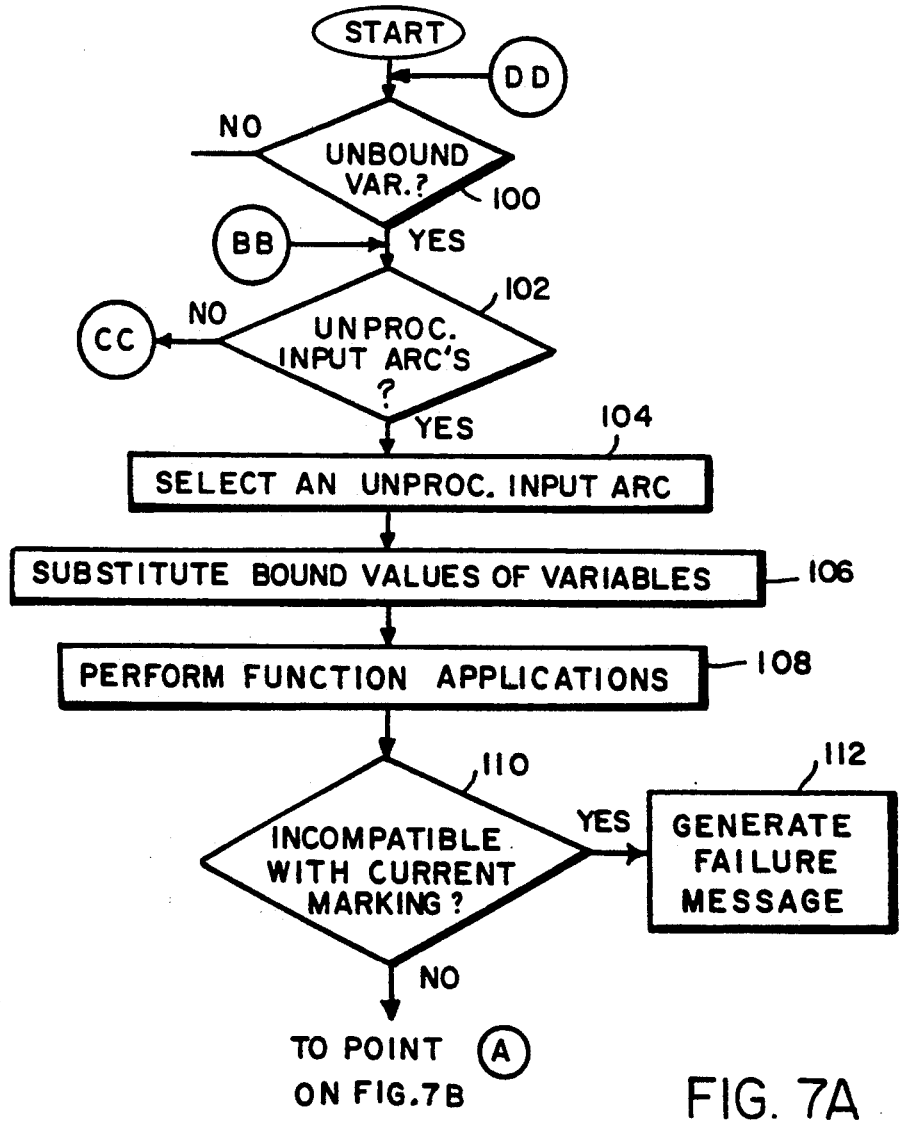
FIGS. 7A-7B are, together, a flow chart of the process for generating a binding function, according to the present invention.
Figure 7B:
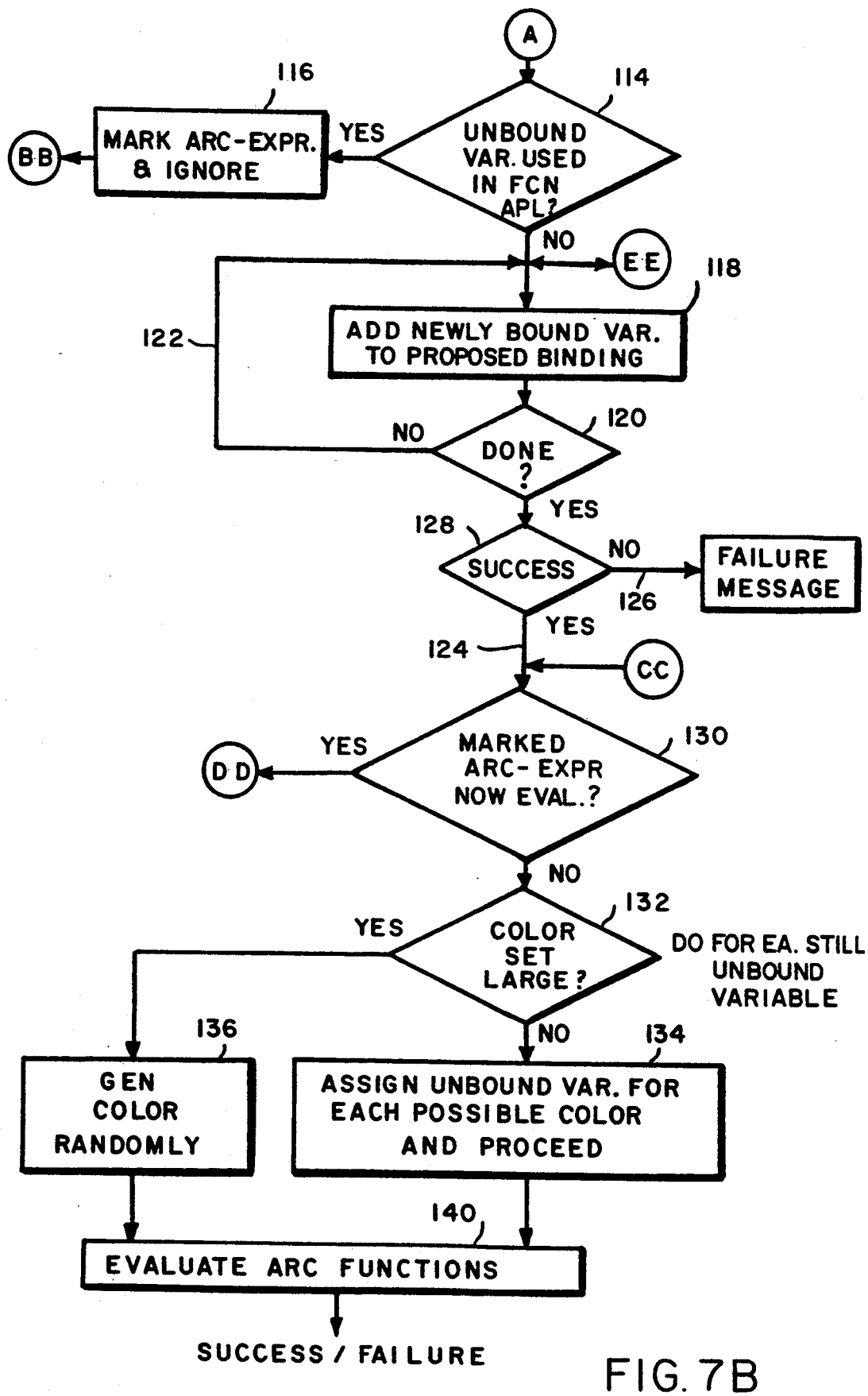

Putting together the steps described above, the process of generating a binding for a transition starts with all of the variables in V(T) unbound. As illustrated in the flow chart of FIGS. 7A and 7B, the process of going from totally unbound variables to a full binding is a tree search which can be characterized recursively. At each node of the tree, all potential bindings must be explored until a success is reached (i.e., a partial binding is found, which appears to meet the requirements). Once a successful potential partial binding is found, the next "lower" level of the tree can be explored. When all possible bindings have been tried at a selected level and there is a failure to find even one possible partial binding, it is necessary to move back "up" the tree to the next "higher" level and there to find another possible partial binding, as the proposed binding has been shown to be incorrect.

First (step 100), determine whether there are any unbound variables. If not, skip to step 140; otherwise, proceed with step 102.

Second, determine whether there are any unprocessed input arcs (step 102); if not, skip to step 130 (point cc).

Third, (step 104), select an unprocessed input arc.

Fourth (step 106), substitute for all bound variables occurring in the corresponding input arc-expression the values to which they are bound.

Fifth (step 108), perform any function applications that may now be carried out (i.e., executed).

The selected arc-expression may now serve as a pattern to be matched against each of the tokens in the current marking of the selected input place associated with the input arc. There are three cases to consider:

Case 1: A test is performed (step 110) to determine if any constants and/or already bound variables in the arc-expression are incompatible with the current marking, in which case pattern matching fails and the currently proposed partial binding cannot be completed. Thus a failure node has been reached in the search tree and a failure message is returned, as indicated at step 112. Control reverts to step 100, point DD, at which time the search moves one node higher on the tree and starts again.

Case 2: The arc-expression cannot be used as a pattern because it contains function applications (including infix operators) which cannot yet be evaluated due to the presence of unbound variables; this is detected at step 114. The arc-expression is marked and ignored (step 116), and processing continues with step 102.

Case 3: The pattern match succeeds. Newly bound variables are then added to the proposed binding. (Step 118). Each such match corresponds to a branch of the search tree. Hence the number of "child" nodes in the tree is equal to the number of different matchable values in the marking. A recursive call of the process is made for each child, as indicated by decision step 120 and line 122. If a match is found for any child node, a success message is returned and control continues on line 124; otherwise, a failure message is returned on line 126 and control reverts to entry point.

Having reached line 124, there are unbound variables. In step 130, arc expressions marked by step 116 are checked to determine if any are now evaluable. If so, control branches to point DD and steps 100-128 are repeated until there are no more unbound variables or no more evaluable arc expressions.

If the No output of step 130 is reached, there may be remaining unbound variables. This can occur for one of two reasons. Such a variable either (a) only occurs in output arc expressions, in which case it can be assigned freely any value from the appropriate color set; or (b) occurs in input arc expressions that are marked by step 116 and remain unevaluable. If so (i.e., if there are unbound variables), there are two possibilities for each still unbound variable. Step 132 determines which possibility applies, for each still-unbound variable. First, an unbound variable may be declared to be of a color set (i.e. type) with only a small number of values. In this case, branches can be generated for each such value, as if there had been a match (i.e., step 134). Second, a color set may be large. In this case, a possible value can be generated by a random selection (possibly a number of attempts). Step 136.

The arc functions can now be evaluated (in step 140) to determine whether the input places contain the appropriate tokens. At this stage, multiple instances of the same token color, and multiple arcs from the same input place express themselves in the multi-sets resulting from the evaluation. Additionally, variable bindings made by random choice will be tested against what is actually possible. If the containment is satisfied, a success message is returned; otherwise, a failure message.

An implementation of this binding-generation process can traverse the tree in a depth-first or breadth-first manner in order to obtain a binding. (The depth-first approach works well for finding the first 'n' bindings fast.) A variant of this function could also return a list of all possible bindings instead of just one binding. Other factors affect the efficiency of this whole process. Some of these factors are discussed below.

Simulating a Model

Assume the occurrence functions are known for each transition in a particular flat model. Also assume the system is in some state $S_1$. The process of performing a simulation step can be described as a sequence of function evaluations. The add transition will be used for purposes of illustration.

The first thing to be determined is whether the add transition is enabled in state $S_1$. Apply the occurrence function for add to the current markings on the input places of add. If the add transition is not enabled, the evaluation will fail and the enabling of other transitions should then be checked, until the enabling of all transitions has been checked. Assume that add is enabled. Then the function will calculate multi-sets using the input-arc functions and the output arc function. Let these be a1d, a2d and rd, respectively. Now, the state $S_2$ can be defined. This is the state arrived at as a result of an occurrence of the add transition in state $S_1$:

$$S_2(arg1) = S_1(arg1) - a1d,$$

$$S_2(arg2) = S_1(arg2) - a2d,$$

$$S_2(result) = S_1(result) + rd;$$

with the rest of the elements in the system unchanged.

If it were desired to allow add to occur concurrently with itself or with any other transition in the model, the following states $S_1$ and $S_2$ would be generated:

$$S_1'(arg1) = S_1(arg1) - a1d,$$

$$S_2'(arg2) = S_1(arg2) - a2d,$$

$$S_2'(result) = S_1(result) + rd;$$

Then a check would be made to see if add or any other transition was enabled in state $S_1'$. If so, the state $S_2$ would be:

$$S_2(arg1) = S_1(arg1) - (a1d + a1d'),$$

$$S_2(arg2) = S_1(arg2) - (a2d + a2d'), \text{ and}$$

$$S_2(result) = S_1(result) + (rd + rd')$$

where the symbol is used as an expression of a concurrently existing state.

Extension of the Binding Function to Include Guards

Figure 8:
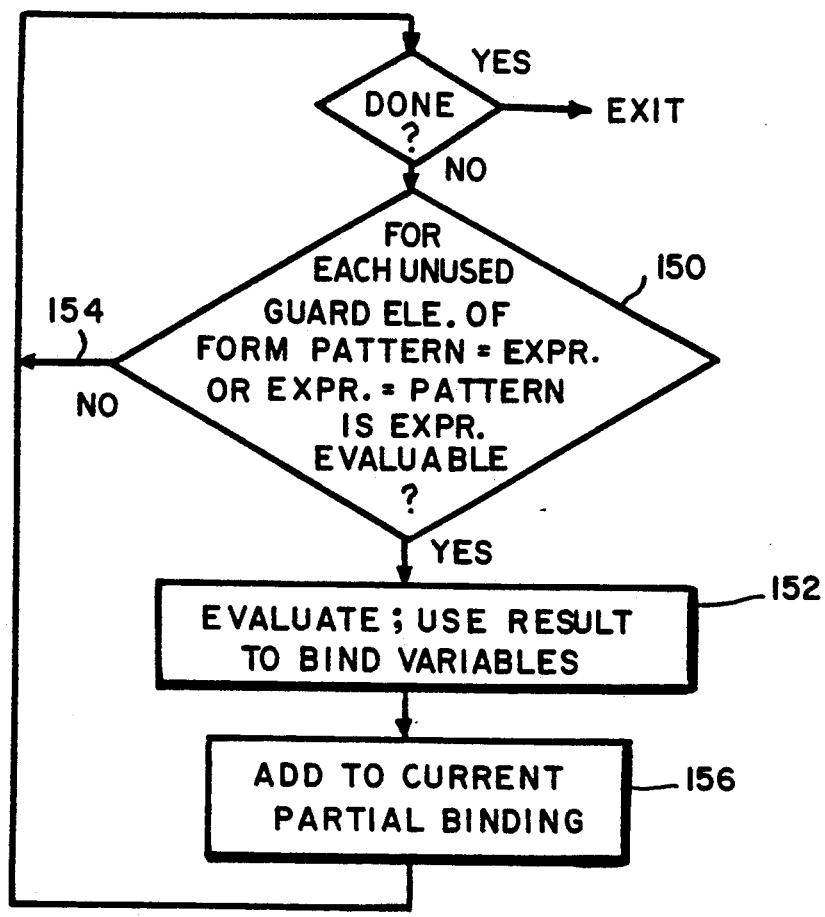
FIG. 8 is a flow chart illustrating the use of a guard function in the binding process.

The association of guard functions with transitions places a further constraint on the binding function. First of all, all variables in the guard must be included in V(T). Secondly, for any proposed binding, the guard must evaluate to a true condition. (Recall that the guard is a Boolean list. Thus, each element of the list must evaluate to true). An easy way of incorporating the guard is simply to add it as a test on the proposed binding. In practice, it is more efficient to use the guard in the process of determining the binding because it reduces the fan-out in the search tree. This can be done as next described, for which reference is made to FIG. 8.

Before processing any input arcs, and after the processing of each useful input arc, examine each un-used element of the guard that has the form "pattern=expression" or "expression=pattern." For any such element, determine if, given the current partial binding, the expression is evaluable (step 150). If so, evaluate it and use the result to bind the variable(s) occurring in the pattern (step 152). If the binding fails (e.g., because already bound variables are in conflict with the equality), the current partial binding cannot be completed and step 150 is re-entered as at 154 (assuming these remain un-used guard elements to consider). Otherwise, the new binding information is added to be current partial binding (step 156).

Figure 9:
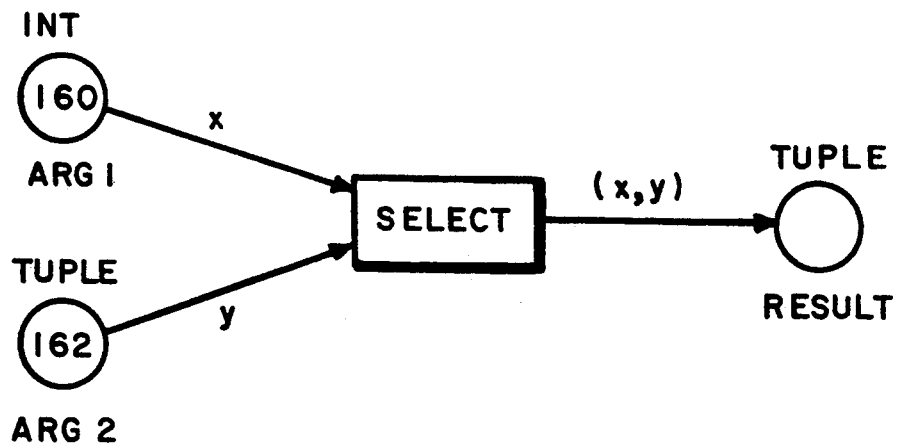
FIG. 9 is a diagrammatic illustration of a net illustrating the efficiency to be gained by precompiling.

The efficiency of the binding process can be greatly affected by the order in which arc expressions are used to bind variables. Consider the simple example of FIG. 9, excised from a larger model.

Suppose that the place 160 (arg1) tends to have very few tokens on it, perhaps at most one at a time. Suppose further that place 162 (arg2) of type tuple typically has many tokens, each with a unique value for x. Under these assumptions, it is much better to use the arc expression from place arg1 first in the binding process. Thus, if the occurrence function is generated dynamically during the simulation of the model, the actual token count can be used to make the occurrence function more efficient. On the other hand, repeatedly redefining occurrence functions during the simulation is in itself very expensive.

Precompiling the Binding Function

Instead, by precompiling, an occurrence function definition applicable to all possible bindings can be created. As such, it cannot depend upon a particular value to which a variable is bound. (In the description of the process of generating a binding, the partial binding is used in the pattern match of FIGS. 7A, 7B. Such values cannot be used in a precompiled pattern match.

The advantage of precompiling all the occurrence functions is simply that, having done this once, the model can be simulated for many steps, potentially executing the same transitions (and hence the same occurrence functions) many times. Some subtlety in the binding process must be sacrificed, though, or a number of different subfunctions must be generated for the same transition, in effect choosing which one to use as a function of the current marking.

Note that the occurrence of any function applications within an arc expression rules out its use in a pattern match, even if the binding process assigns values to variables such that the arc expression can be simplified to a pattern.

Further, pattern matching on more than one variable cannot take advantage of a previously bound variable. Consider the example of FIG. 9. There, even if the process binds x first, because of precompiling the pattern match for arg2 would be (_, y), where '_' stands for "don't care".

Hierarchical Colored Petri Nets

Using a hierarchy of Colored Petri Nets, a set of subnets called pages can be related to each other in such a way that they together form a single system model. Thus the system modeller can describe the complex system as a set of less complex submodels which all contribute to a much larger model in which the submodels interact with each other in a well-defined way. Each submodel can be separately designed, or described. This idea is well-known from other kinds of artificial languages, such as submodels in SADT and subroutines in programming languages.

It is important not to confuse this idea of hierarchical nets with the many approaches which, instead, merely relate two or more separate subnets to each other without combining them into a single model. In these other approaches, each page defines its own model; the goal is to compare these individual models (e.g., showing that they have an equivalent behavior or that they describe the system from different viewpoints). In the domain of programming languages, these latter approaches are equivalent to program transformations. The models are different descriptions of the same system and they are not used to obtain a larger and more complex description.

Although one of the main objectives of this invention is to synthesize larger models from smaller submodels, the approach also has some elements which allow the user to create a number of related models. However, each of these models is usually synthesized from several submodels. The idea is most easily explained by considering the notion of a "substitution node", which is a place or a transition related to a submodel. Usually, the submodel totally replaces the substitute node and the surrounding arcs; hence, it does not make sense to say that a substitute transition occurs or that a substitute place is marked. The substitution node is not itself part of the final model. Its role is merely to describe how the related submodel is inserted in the synthesized model (much as an in-line subroutine call describes where to insert the subroutine code). During the analysis of a complex system, it is often convenient, temporarily, to be able to ignore parts of the model or replace them with simpler components. In the present invention, this is achieved by allowing the user to specify for each substitute node whether the related subpage should be included in the current synthesized model or not. When the submodel is not included, the substitute node becomes an ordinary node. This means that the node can occur (if it is a transition) or become marked (if it is a place). In order for this to be useful, it is, of course, necessary that there be some formal or informal correspondence between the behavior described by the model into which the submodel is inserted and the model in which the substitute node is an ordinary node. Probably, the most obvious relationship is to make the two models equivalent. This means that the substitute node, with its surrounding arcs, is behaviorally equivalent to the related submodel. Such a strict equivalence, however, is by no means the only interesting kind of relationship. Another possibility is to let a substitute transition describe the normal behavior of an activity while the related submodel, in addition, describes several kinds of abnormal behavior (e.g., time-outs and losses of messages or signals). This allows the user to have two related models: (1) a crude one in which he can investigate the normal behavior and (2) a more complex one also coping with abnormal behavior. The user can switch between the two models (e.g., first investigate the simple one and then go on with the more complex one). The two models share most of the submodels; this means that changes in one of them automatically apply to the other.

To cope with large systems in practice, strong structuring tools are need. The first very substantial step on this path was to replace ordinary Petri Nets with high level Petri Nets such as Predicate/Transition nets and Colored Petri Nets. The second step, explained here, is to introduce hierarchical models. In terms of programming languages, the first step can be compared to the introduction of types allowing the programmer to work with structured data elements instead of single bits. The second step may be compared loosely to the development of programming languages with subroutines allowing the programmer to work with reusable patterns. From a theoretical point of view, machine languages (or even Turing machines) are equivalent to the most powerful modern programming languages. From a practical point of view, this is, of course, not the case. One of the most important limitations that system developers face today is their own inability to cope with many details at the same time. In order to develop and analyze complex systems, they need structuring tools which allow them to work with a selected part of the model without being distracted by the low level details in the remaining parts. The hierarchical Cp-net approach provides the Petri Net modeller with such abstraction mechanisms.

Hierarchies in Behavioral Models

In the area of system modeling and design, the inadequacies of single-level system models are well known: an overview of the system is lacking; too many details are presented at one time; and the structure of the system in question is not mirrored adequately.

Hierarchical modeling languages have been introduced to overcome these problems and have been in practical use for quite some time. Among others are SADT and IDEF, Yourdon's data flow diagrams, and state charts. For the majority of such hierarchical modeling languages, a set of nice features can be listed: They hide details in a consistent way; they separate into well-defined components; their components are reusable; they support both top-down and bottom-up development strategies; and, they have strong graphical expressive capabilities. However, these languages do not provide very much desired trait: executability. Executability implies that the modeling language supports the notion of behavior for its components in a precise and consistent way and makes it possible to observe the execution of large complex system models at different levels of detail. Most of the modeling languages in the group above do not possess these executability properties.

In contrast, high-level Petri Nets have, in recent years, been acclaimed as excellent modeling languages for expressing concurrent behavior in a natural and sound way. Part of the reason is the mathematical (formal) basis underlying high-level Petri Nets. Recently, the practical use of CP-nets (and Predicate/Transition nets) has been accelerating in areas such as protocol verification and design of computer integrated flexible manufacturing systems. However, up to this point, the CP nets and most other kinds of Petri Nets have been considered as flat models.

In both literature and practice, Petri Net models with a consistent use of hierarchical structuring are almost non-existing although some ideas can be found in isolated papers. Recently, several articles showing rather complex high-level Petri Net models have been presented. However, these models only use multi-level structuring in an informal and rather ad hoc way. Especially for computer-supported editing, execution and formal analysis of such models in a more consistent framework is necessary.

From discussions, experiments, application of metaphors, and comparison to related models, we have developed five hierarchy constructs. Each of these gives CPN's a more useful and more flexible expressive power. The aim of the hierarchy constructs is to guide the analyst to produce structured models by supplying a set of sound and consistent structuring concepts.

Hierarchies in CP Nets

For purposes of explanation, the point of departure is the ordinary non-hierarchical CP-net. The transitions can be seen as schemes for behavior, in the sense that the actual binding determines the details of the behavior. The number of tokens moved along an arc may depend upon the actual binding and it may even, for some bindings, be zero. A set of transitions and bindings occurring concurrently is called a "step" (though that word may be used in a more colloquial sense, as well). A diagram is a set of related non-hierarchical CPN's called "pages".

The semantics of the new hierarchy constructs are defined by showing how each use of them can be translated into an equivalent non-hierarchical CP-net which has exactly the same reachable system states and enabled steps. This approach of introducing new language constructs by specifying a translation to well-known old constructs is traditional. Exactly the same thing was done when CP-nets (and Predicate/Transition Nets) were defined by means of ordinary Petri Nets (PT nets). It should be stressed that the only purpose of this translation is to define and present the hierarchy constructs without constructing an intermediate flat CP-net. This extension of CP-nets implies that the existing analysis methods must be extended to cope directly with hierarchical CP-nets.

Substitution Transitions

Consider now a first metaphor: the hardware plug-in, e.g., a silicon chip. Imagine a component with a set of interface posts or terminals. Such a component can be connected to a given environment (e.g., circuit) by means of socket connectors which are attached to the posts. Whenever a specific component of this kind is used, the only thing to be done is to specify the correspondence between sockets and posts. Going back to the CP-nets, a transition may be considered as such a component and its surrounding places as the interface to the environment.

EXAMPLE 1: SIMPLE ASSEMBLY LINE

Figure 10:
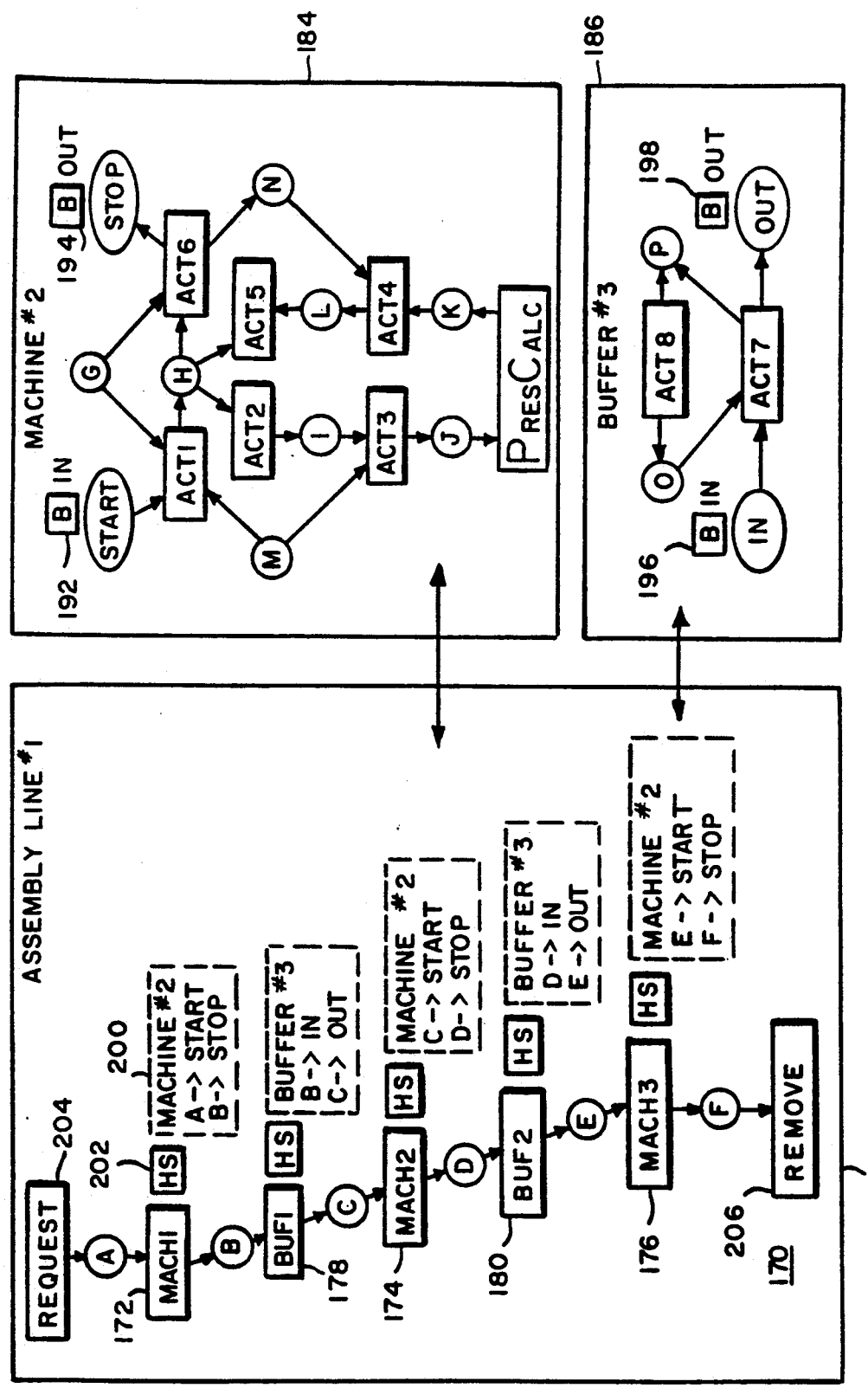
FIG. 10 is a diagrammatic illustration of a model, according to the present invention, of a simple assembly line in a factory of three machines and two buffers, with the machines and buffers represented as substitution transitions.

An example will help to clarify the idea. Referring to FIG. 10, consider a simple assembly line 170 in a factory consisting of three machines 172, 174 and 176, and two intermediate buffers 178 and 180. The machines are identical and need be model led only once. The same is true for the buffers. The page 182 in the left part of FIG. 10 represents each machine, Mach1 and Mach3, and each buffer, Buf1 and Buf2, as a substitute or substitution transition. The details of the machines and buffers are described on two other pages 184 and 186 in the right part of FIG. 10. The result is a hierarchical CP-net where five substitution transitions 172, 174, 176, 178 and 180 at page 182 are related to two subpages 184 and 186, designated Machine#2 and Buffer#3, respectively. (Each page is denoted by a page name followed by "#" followed by a page number). The interfaces of pages Machine#2 and Buffer#3 (i.e., 184 and 186) are defined by the B-tags 192, 194, 196, 198 and the inscriptions "In" and "Out" next to them. The relationship between each of the substitution transitions and the corresponding subpage is defined by the inscription (e.g., inscription 200) next to the associated HS tag (e.g., HS tag 202) (HS=Hierarchy+Substitution). This inscription tells the name and the number of the subpage and it describes how each of the places surrounding the compound transition is assigned to one of the border nodes of the subpage. Most of the other net inscriptions have been omitted to focus more on the net structure than the details of color sets, arc expressions, and so forth.

From page 182, Assembly Line#1, one gets an overview of the assembly line. To feed the line and remove the produced items, two ordinary transitions have been added: Request 204 and Remove 206. The behavior of the machines is described at page 184, Machine#2, by means of seven lower level activities (i.e., transitions) Act1-Act7. The buffers are described at Buffer#3, page 186. They are very simple and might instead have been inserted at page 182, Assembly line#1. However, by describing them on a separate page, they have been abstracted in a way which later allows for confined experimentation with the details of the buffers without altering any other part of the diagram.

Compare this approach with the earlier abstraction mechanisms in CP-nets. In order to represent three instances of the same machine in a compact way, one could have folded them into the CP-net of Machine#2 by introducing an additional machine-identification component of the color sets for all the places representing the machine states. A similar thing then could have been done with the buffers. A problem would, however, arise if, afterwards, one tries to relate the machines and buffers to each other. For example, the fact that Mach1 is the only machine that delivers input to Buf1 would then have had to be encoded in the guard of transition Act7 and Buffer#3. To continue in that way would soon become cumbersome. Folding is well-suited when exactly identical objects are employed, but less-suited for asymmetrical arrangements.

Figure 11:
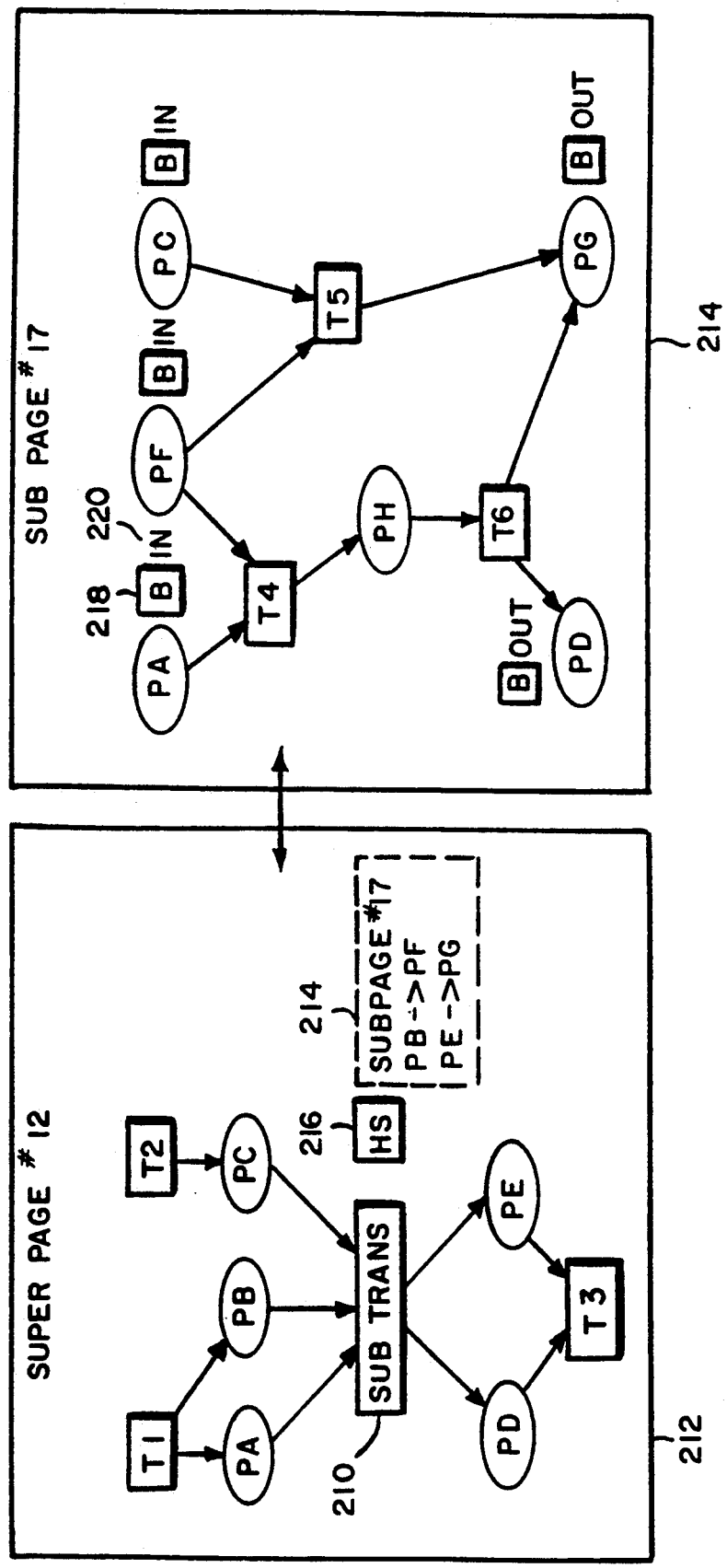
FIG. 11 is a diagrammatic illustration of a superpage and a subpage, further illustrating the interrelationship of socket places and port places.

We will now be more precise on the terminology. Each substitution transition designates a page. This page is said to be a subpage. Such a substitution transition represents the component as a black box, whereas the subpage contains the details of how this component actually performs the activity. The substitution transition is a shorthand for the CP-net on the subpage. FIG. 11 illustrates the idea of this node-to-page relationship for an abstract net. The substitution transition 210 and its page 212 are, with respect to the subpage 214, said to be a supernode and a superpage. For simplicity, most of the CP-net inscriptions are again omitted. The substitution transition, SubTrans 210, can be recognized by the HS-tag 216. SubTrans 210 has five surrounding places PA, PB, PC, PD and PE which are called socket places; three of these (PA, PB and PC) are input socket places and two are output socket places. Five places on the subpage, (PA, PC, PD, PF and PG) are defined to be port places and, hence, are marked by B-tags (e.g., B-tag 218). The port places represent the posts from the hardware metaphor. They are the interface to the upper level at which the subpage is plugged in and used. The relationship between socket places and port places is called the port assignment. It is a function mapping sockets into ports. The port assignment is shown in the inscription PB→PF, PE→PG next to the HS-tag of the substitution transition. The first line of the inscription tells the name and number of the subpage. Each of the remaining lines describes the assignment between a socket and a port. By convention, the only sockets mentioned are those which are unassigned or assigned to a port with a different name. In this case, the lines PA→PA, PC→PC and PD→PD have been omitted. It is required that all socket nodes be assigned and that a socket node be assigned to a port node with an identical color set. The port assignment function is, however, allowed to be non-injective and non-surjective. The inscriptions next to the B-tags of port nodes (e.g., inscription 220) tell whether the assigned socket node has to be an input, output or input/output node for the substitution transition. The modeller can also define a port node to be general, and this means that all three kinds of socket nodes can be assigned.

System components are reusable. Once a given building block has been designed and verified, it may be used at several locations. Hence, an important feature of this framework is that the same page may be used as a subpage for several substitution transitions even on different pages. The assembly line example uses both Machine#2 and Buffer#3 as multiple use plug-ins.

Semantics of Substitution Transitions

Figure 13:
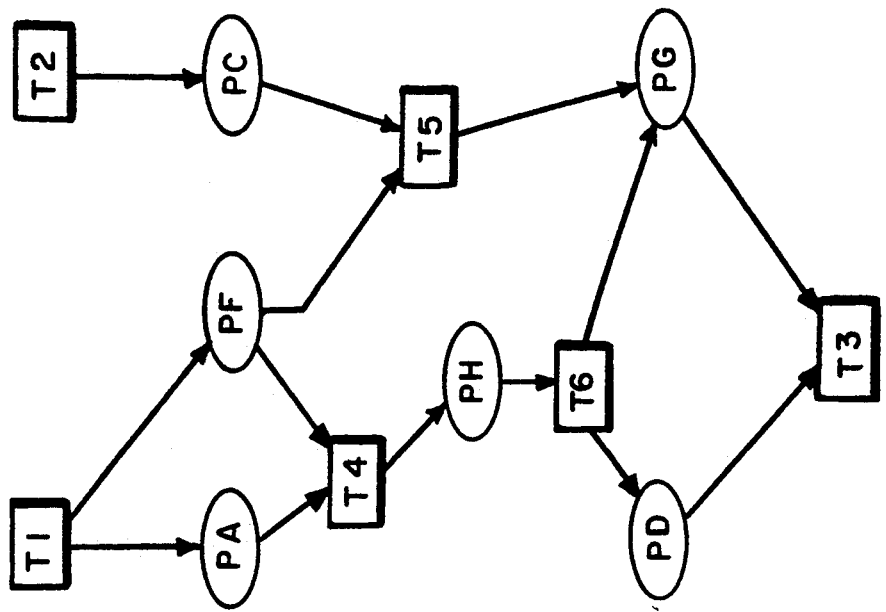
FIGS. 12 and 13 diagrammatically illustrate the two-step translation of a hierarchial CP-net according to the invention, into an equivalent non-hierarchial net, including the merger of socket places with corresponding port places.
Figure 12:
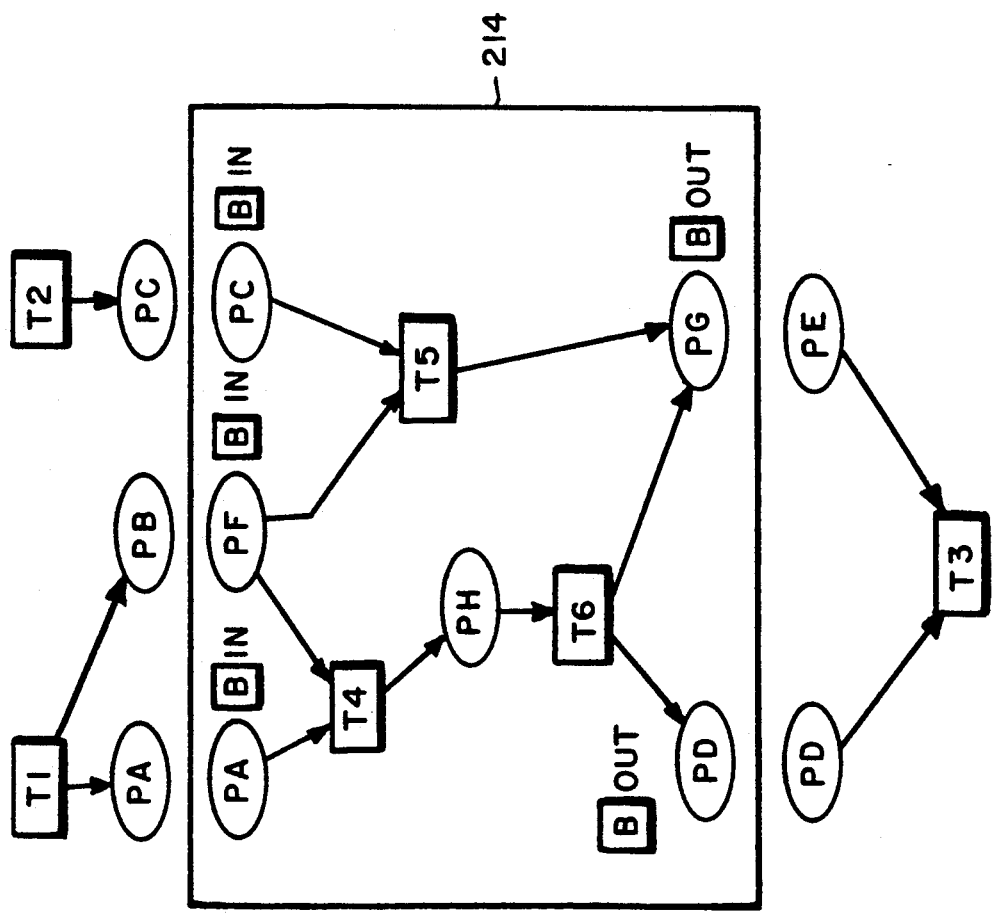

To define the semantics of a substitution transition such as sthe substitution transition 210 of FIG. 11, FIGS. 12 and 13 show how to translate it into an equivalent non-hierarchical CP-net. This is done in two steps. First, the substitution transition 210 (together with its surrounding arcs) is deleted and a copy of the corresponding subpage 214 is inserted, as FIG. 12 illustrates. Second, each socket place is merged with the assigned port node. FIG. 13 shows the merger. In general, the result of a merge of two nodes A and B is a node C with a set of arcs which is the union of the arcs of A and B. In the case where two or more socket places are assigned to the same port, only one of them is merged with the port place and then all the socket places are "glued" together by means of an instance fusion set (which is introduced later). Unassigned ports are left alone, i.e., they are not merged into another node.

Each subpage is a template. From that template, copies can be made to replace the corresponding substitution transitions. Such copies are referred to as (substitution) instances of the actual page. The initial marking of the subpage is copied together with the net structure. Each port place, however, inherits (and shares) the initial marking of the assigned socket (if any). The page instances form the instance hierarchy and one can speak about "superinstances" and "subinstances" in a similar way one refers to superpages and subpages.

· Given the semantics above, it should be clear why it makes no sense to talk about enabled or occurring substitution transitions. They are not an executable part of the model because they are substituted by the subpage.

Substitution Places

Figure 14:
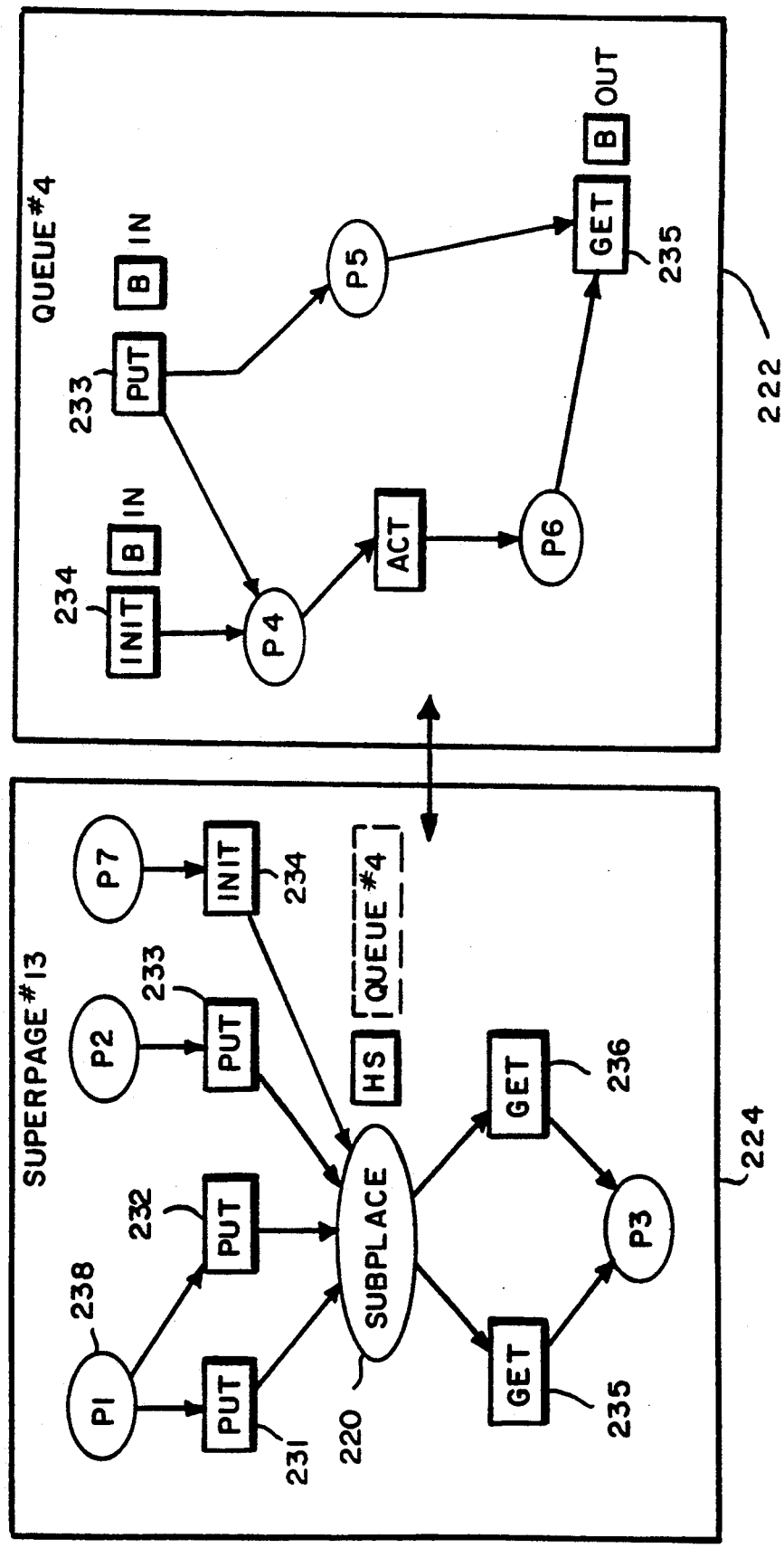
FIG. 14 is a diagrammatic illustration of a substitution place and its subpage.

Analogous to the treatment of substitution transitions, the plug-in metaphor is used for places as well. A substitution place is the term for a more detailed subnet which the analyst wants to hide at the upper level of abstraction. Each substitution place has an interface which consists of transitions and it behaves in a way which resembles an abstract data type. FIG. 14 shows a substitution place SubPlace 220 together with its subpage 222, Queue#4.

At the superpage, SuperPage #13 (224) the substitution place 220 outlines a simple data type, a queue with three operation handles: Init, Put, and Get. In this case, Init is called once, Put three times and Get twice. These calls are represented by the six socket transitions 231-236 surrounding SubPlace. As for substitution transitions, some port nodes are allowed to be unassigned. Moreover, as illustrated above, several socket transitions (e.g., 231 and 232) are often assigned to the same port (e.g., 238). At the subpage, the three operations are described in more detail and the interface to them is represented by the three port transitions.

Semantics of Substitution Places

Figure 16:
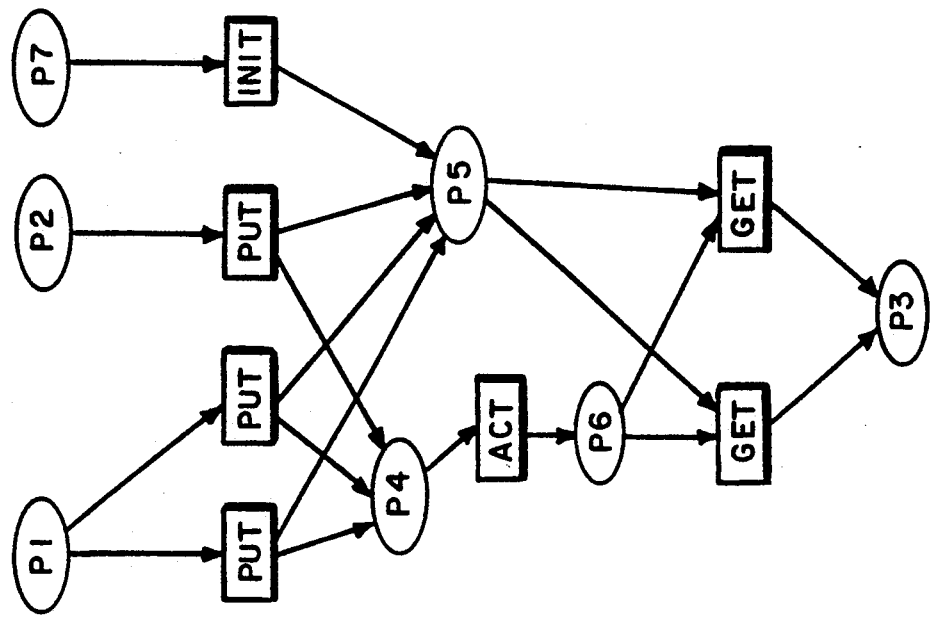
FIGS. 15 and 16 together diagrammatically illustrate the steps defining the semantics of substitution places.
Figure 15:
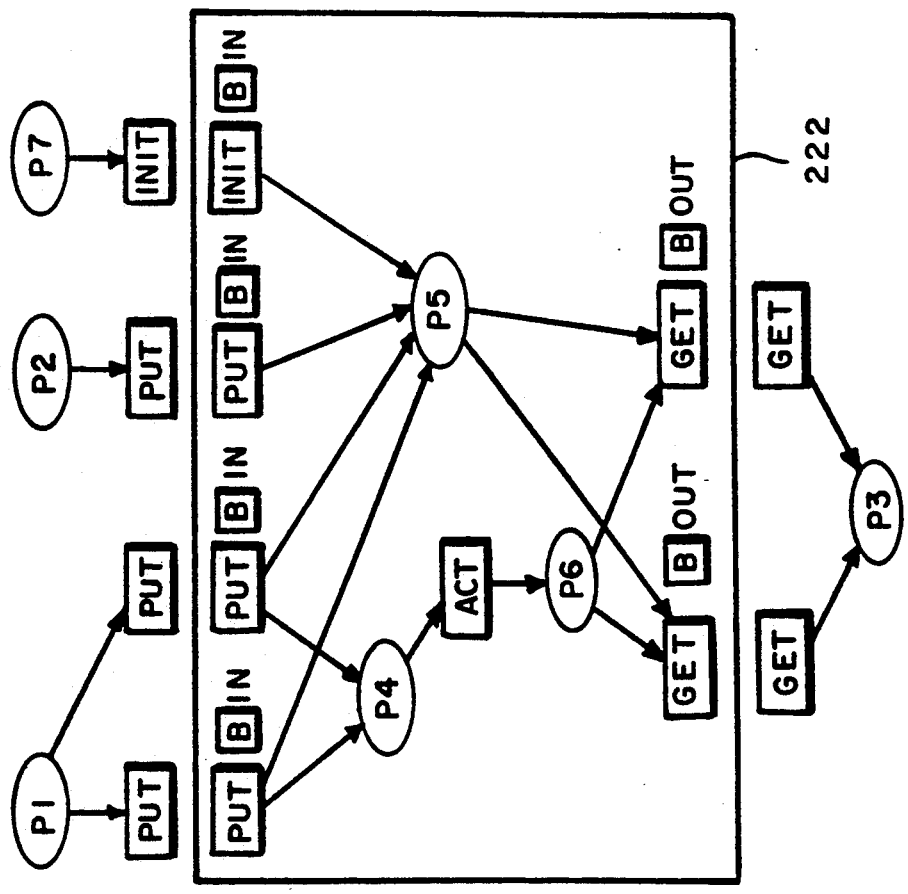

The semantics of substitution places is similar to the semantics of substitution transitions. The roles of places and transitions are, however, reversed and, in addition to this, there are a number of minor differences. The definition of the semantics of a substitution place involves two steps, illustrated in FIGS. 15 and 16 for the net in FIG. 14. First, the substitution place (together with its surrounding arcs) is deleted, a copy of the subpage 222 is created and each port transition is duplicated to obtain a copy of each of the assigned socket transitions. This is shown in FIG. 15. The result of a duplication of a node A is a new node B which has exactly the same set of arcs as A. When a port has only one assigned socket node, no duplication is needed. Unassigned ports are deleted. Second, each socket transition is merged with a copy of the port transition to which it is assigned (See FIG. 16); the guard in the resulting transition is the conjunction of the guards for the socket node and the port node. The merge implies that a socket transition has to occur together with its corresponding port transition as a single indivisible state change.

EXAMPLE 2: SMALL FACTORY UNIT

Figure 17:
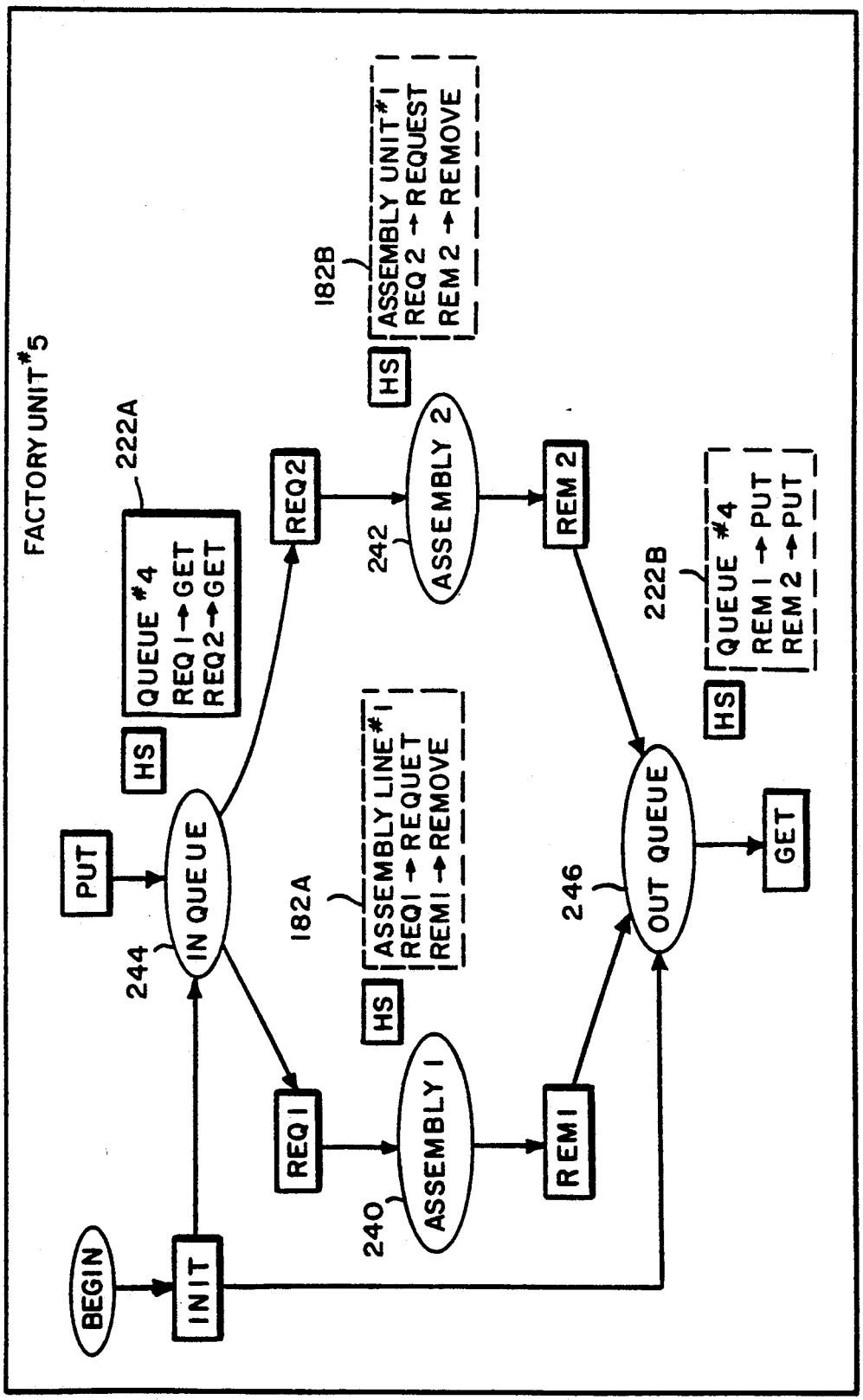
FIG. 17 is a diagrammatic illustration of a model of a factory unit with two assembly lines, showing AssemblyLine#1 used as a subpage for each of two substitution places.

Consider again the assembly line. Assume a designer wants to use it as a building block in a larger system. Hence, transitions Request 204 and Remove 207 are defined to be port transitions by placing a B-tag next to them (i.e., associating a B-tag with each of them). Assembly Line#1, 182, is then used (at 182A, 182B) as a subpage for each of two substitution places Assembly1 and Assembly2 (240, 242, respectively), as shown in FIG. 17. In addition, Queue#4 (222) from FIG. 14 is used as a subpage 222A for a front-end queue 244 named InQueue and as a subpage 222B for a back-end queue 246 named OutQueue. This small example illustrates how easy it is to extend the scope of a model by inserting it as a submodel in a larger model.

A substitution place SP is not allowed to be neighbor to a substitution transition ST. The reason is that it then would be impossible to construct an equivalent non-hierarchical CP-net by the method defined above, because SP is socket for ST and vice versa. It is possible to extend the foregoing concepts to cover such a case, though.

Abstracting data types is one of the most well-known and useful abstraction mechanisms in computer science and it has been important for us to allow the user to apply a similar concept for CP-nets. As shown above, this can be done by means of substitution places where the port transitions represent the exported operations and the socket transitions the operation calls. There is, however, an additional set of problems which have to be solved. Suppose that the three calls of Put in FIG. 14 use different expressions to describe the tokens which are given to the queue. Such a difference should not be specified at the subpage, but at the socket transitions. Thus, the arc expressions of the port transitions are allowed to refer to the arc expressions of the socket transitions by means of special identifiers (details are described in P. Huber, *Hierarchies in Coloured Petri Nets*, Specification paper for the CPN Palette—Part 2, Version 1.0, Meta Software Corporation, Cambridge, Mass., 1989, which is hereby incorporated by reference).

Invocation Transitions

Other ways exist to relate nodes and pages. For transitions, for example, the metaphor of subroutines may be applied. A subroutine is declared with a set of formal parameters and it can be invoked (i.e., called) from different locations by supplying a set of actual parameters. Each call implies a temporary instantiation of the subroutine.

EXAMPLE 3: PRESSURE CALCULATION

Figure 18:
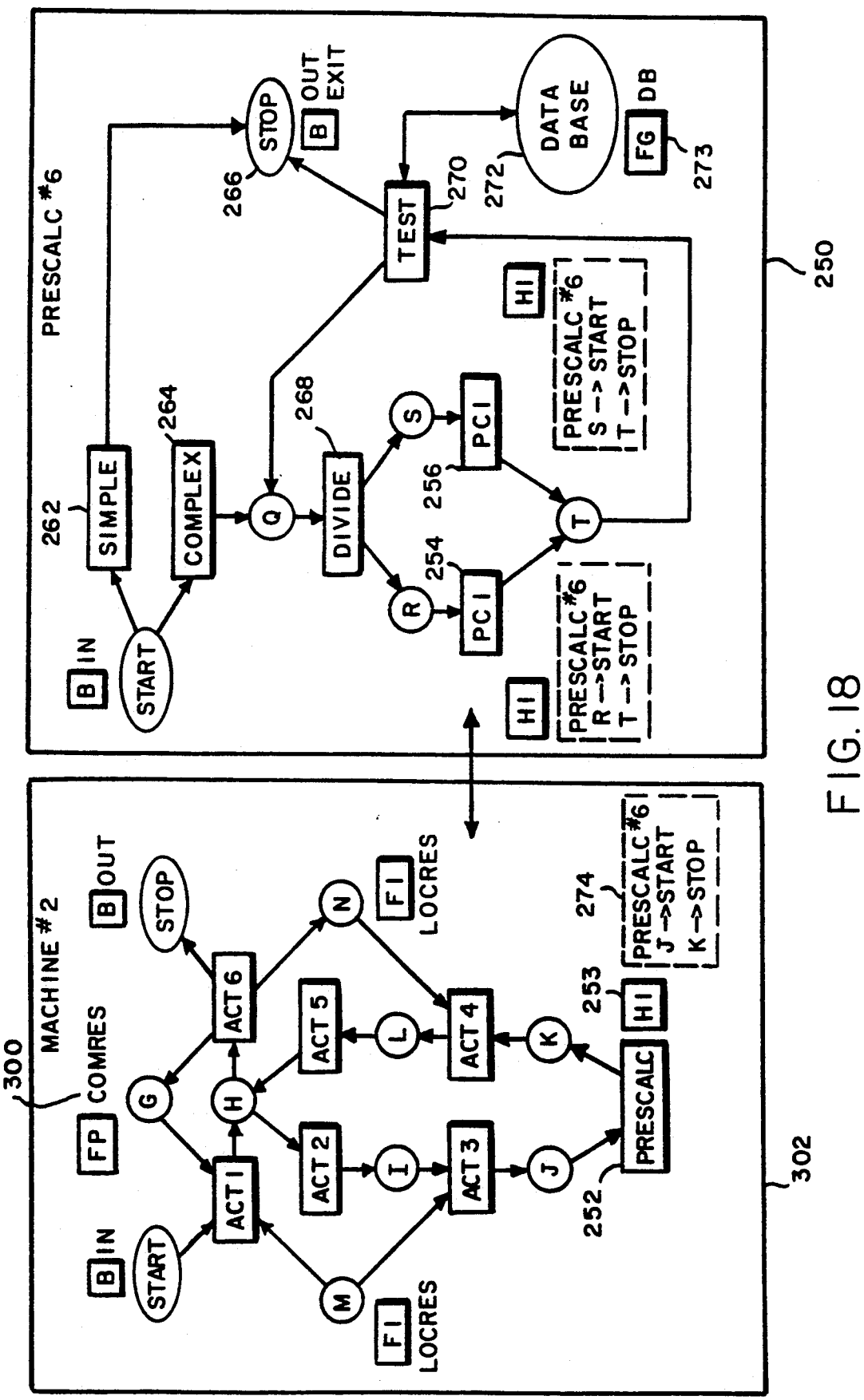
FIG. 18 is a diagrammatic illustration of an exemplary control function calculation implemented according to the present invention, showing the use of invocation transitions.

Consider once again the assembly line and assume that the machines 172, 174 and 176 of FIG. 10 use a complicated recursive algorithm for calculating the correct work pressure for Act4. To specify this, a subpage 250 (PresCalc#6) is defined, as shown in FIG. 18. It is invoked by three different invocation transitions: PresCalc 252 (at Machine #2), PC1 254 and PC2 256 (at PresCalc#6). In contrast to substitution nodes, the invocation transitions are not substituted by their subpage. This means that they can occur, and that each of their occurrences triggers the creation of a new instance of the subpage. These subpage instances are executed concurrently with the other page instances in the model until some specified exit condition is reached. When an invocation page instance is created or terminated, tokens are passed between the invocation transition and the subpage instance, similar to the way in which parameters are passed between a subroutine call and the subroutine execution.

Each invocation of PresCalc#6 receives a token from the input node of the calling invocation transition and then classifies the task as either simple 262 or complex 264. In the first case, the result is immediately calculated and passed back to the invocation transition via Stop 266 and the execution of the subpage is destroyed because an exit place received a token. In the second case, the task is divided by transition 268 into two recursive subtasks (represented by PC1 and PC2). The results of the two subtasks are tested by transition 270 against a database 270 and, finally, a token is put either on Stop place 266 (if the test was positive) or on place Q (if the test was negative).

In terms of the subroutine metaphor, the invocation subpage represents the subroutine description while the invocation transition represents the subroutine call. All the ports must be places and they represent the formal parameters. The places surrounding the invocation transition are called parameter places and they represent the actual parameters. The invocation transition is distinguishable by the HI-tag (HI=Hierarchy+Invocation) 253 and the inscription 274 next to it specifies the subpage and the port assignment relating parameter nodes to port nodes. The rule for port assignment is identical to that of substitution nodes and this means that there may be more formal than actual parameters.

The termination of subroutine execution is usually triggered by execution of the last statement or by an explicit exit statement. In the present framework, it is not always possible to talk about the last node; the analyst is only permitted to define exit nodes. The execution is terminated the first time and exit transition occurs or an exit place receives a token.

Semantics of Invocation Transitions

Figure 19:
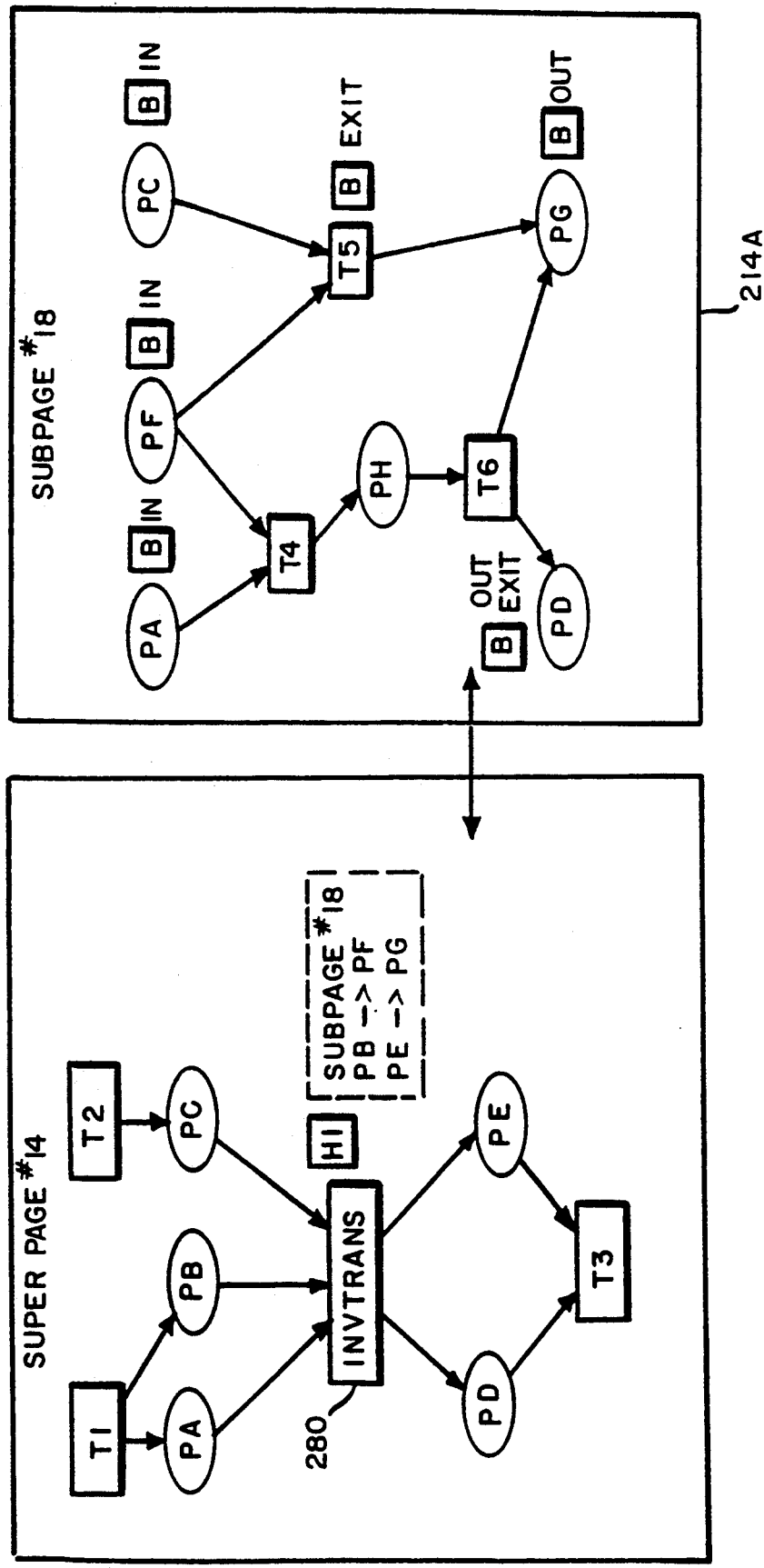
FIG. 19 is a diagrammatic illustration of the semantics of an invocation transition, showing the creation of a new instance of the invocation subpage.

The enabling rule for invocation transitions is identical to that of ordinary transitions, but an occurrence of the invocation transition (e.g., invocation transition 280) implies a temporary extension of the CP-net, as illustrated in FIG. 19:

a) First, a new instance 214A of the invocation subpage is created. This subpage may contain substitution nodes and, when this is the case, it is necessary also to create new page instances of the corresponding substitution subpages. These page instances become subinstances of the invocation page instance and they may themselves have subinstances (if they contain substitution nodes). The arc expressions on the input arcs of the invocation transition are evaluated and the corresponding tokens are subtracted from the input parameter places and added to the assigned port places (in the invocation instance).

b) Second, the invocation instance and its subinstances are executed. This execution is concurrent to the rest of the diagram and it continues until an exit transition (e.g., T5 occurs or an exit place (e.g., PD) receives a token.

c) Third, all the tokens on output port places are copied to the assigned output places of the invocation transitions. Then the invocation instance and its subinstances are removed from the CP-net and any token information which might be left in them is lost.

For substitution nodes, one can statically calculate the equivalent non-hierarchical CP-net. For invocation transitions, this is not possible and it is necessary dynamically to extend and shrink the equivalent non-hierarchical CP-net. Without invocation, each page has a constant number of instances; but with invocation, the number of page instances may change (even for pages which only are substitution subpages). Moreover, each invocation transition can have any page as a subpage (as long as the ports are places). This means that the invocation hierarchy is allowed to contain circular (i.e., recursive) dependencies while the substitution hierarchy is restricted to being acyclic (to avoid infinite substitution).

The token passing in steps (a) and (c) above is analogous to the use of in, out, and in+out parameters in subroutines. This is also sometimes known as call-by-value and call-by-result. Some programming languages, e.g. Pascal, allow subroutines to be passed as parameters to other subroutines. Analogously, token colors might be allowed to represent CP-nets.

Fusion Sets

Figure 20A:
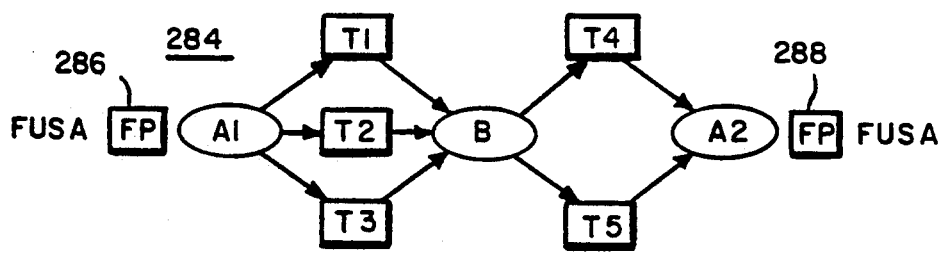
FIG. 20A is a diagrammatic illustration of the nodes of a fusion set.

The main idea behind fusion is to allow the system modeller conceptually to fold a set of nodes into a single node without graphically having to represent them as a single object. A fusion is obtained by defining a fusion set containing an arbitrary number of places or an arbitrary number of transitions. The nodes of a fusion set are called fusion set members. This idea is illustrated in FIG. 20A where the CP-net 284 has a fusion set called FusA. This fusion set contains the fusion set members A1 and A2 which are distinguishable by the FP-tags (FP=Fusion+Page) 286, 288. FusA is a page fusion set; this means that it is only allowed to have fusion set members from a single page in the diagram. For the moment, assume that this page only has one instance.

Figure 20B:
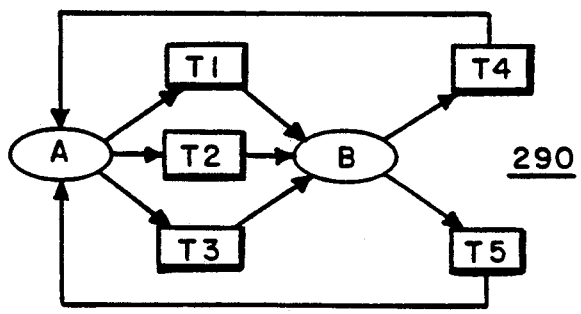
FIG. 20B is a diagrammatic illustration of a non-hierarchial CP-net equivalent to the net of FIG. 20A, obtained by merging fusion set member A1 into A2.

Then the equivalent non-hierarchical CP-net 290 is shown in FIG. 20B. It is obtained by merging fusion set member A1 into A2 (or vice versa). Intuitively, this semantically means that the places A1 and A2 share the same marking.

Figures 21A, 21B:
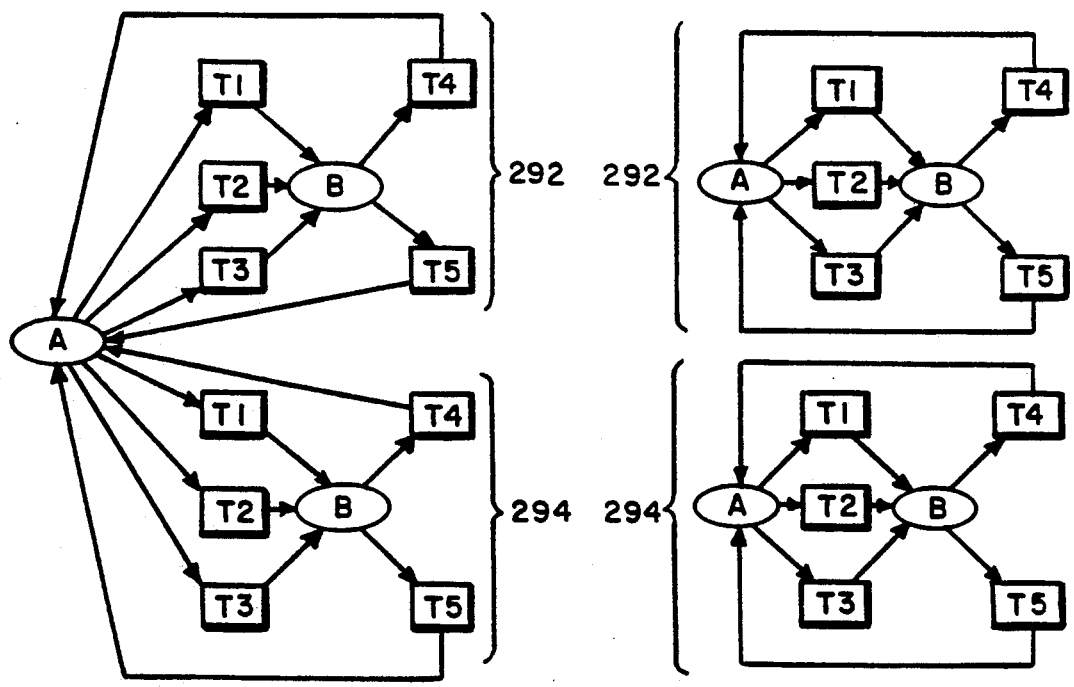
FIGS. 21A and 21B are diagrammatic illustrations of, respectively, a page fusion set and an instance fusion set for a net in which the page of fusion set FusA has more than one page instance.

Now consider the case where the page of fusion set FusA has more than one page instance. There are then two possibilities. Either all instances of all fusion set members can be merged into a single conceptual node or they can be merged into a node for each instance, i.e., only node instances which appear in the same page instance. The two possibilities are illustrated in FIGS. 21A and 21B where it is assumed that the page has two page instances 292 and 294. Both possibilities are useful; thus, the user is allowed to specify which of them he wants. The possibility FIG. 21A is obtained by making fusion set FusA a page fusion set, while the possibility of FIG. 21B is obtained by making it an instance fusion set (with FI-tags).

Finally, global fusion sets (with FG-tags) are allowed. This permits fusion set members from all pages in the diagram, and all instances of these nodes are merged into a single conceptual node. This means that a page fusion set is a special case of a global fusion set and, seen from a theoretical point of view, the concept of page fusion sets could have been omitted. However, when CP-nets are used to model large systems, it is important to be able to distinguish between global fusion sets and page fusion sets. In a computer supported environment, this gives the analyst an easy way to avoid unintended fusion of two fusion sets which by coincidence have the same name.

The members of a fusion set must be comparable to each other. For places, this means that they must have the same color set and the same initial marking. It also means that they either must all be ordinary places or all be substitution places; and, in the latter case, they must all have the same subpage. Fusion of substitution places is useful when one wants to apply the same instance, e.g., an abstract data type, at several locations in the diagram. The cache coherence protocol modeled in the Huber paper illustrates the use of this facility.

Exactly the same set of concepts applies to transition fusion. For transitions, the guards are not necessarily identical. Instead, the conjunction of the guards is formed. The members of a transition fusion set must all be (a) ordinary transitions, (b) substitution transitions, or (c) invocation transitions. In the latter two cases, they must all have the same subpage. When applied to nodes at a single page with only one page instance, fusion is mainly a drawing convenience. However, when applied to nodes at different pages, or to pages which have several instances, fusion becomes a strong description primitive in its own right, and it supplements the notions of substitution and invocation in a very fruitful way.

EXAMPLE 4: RESOURCES IN THE ASSEMBLY LINE

In FIG. 18, the use of all three kinds of fusion sets is illustrated. Resources shared by all machines are modeled by a page fusion set ComRes 300, while resources local to one machine are modeled by an instance fusion set LocRes, 302. Finally, the Data Base is modeled by a global fusion set DB 273, since another page (not shown) has the responsibility of updating the database. When modeling the data base as an abstract data type, the corresponding places become both substitution and fusion places.

Page Hierarchy

Figure 22:
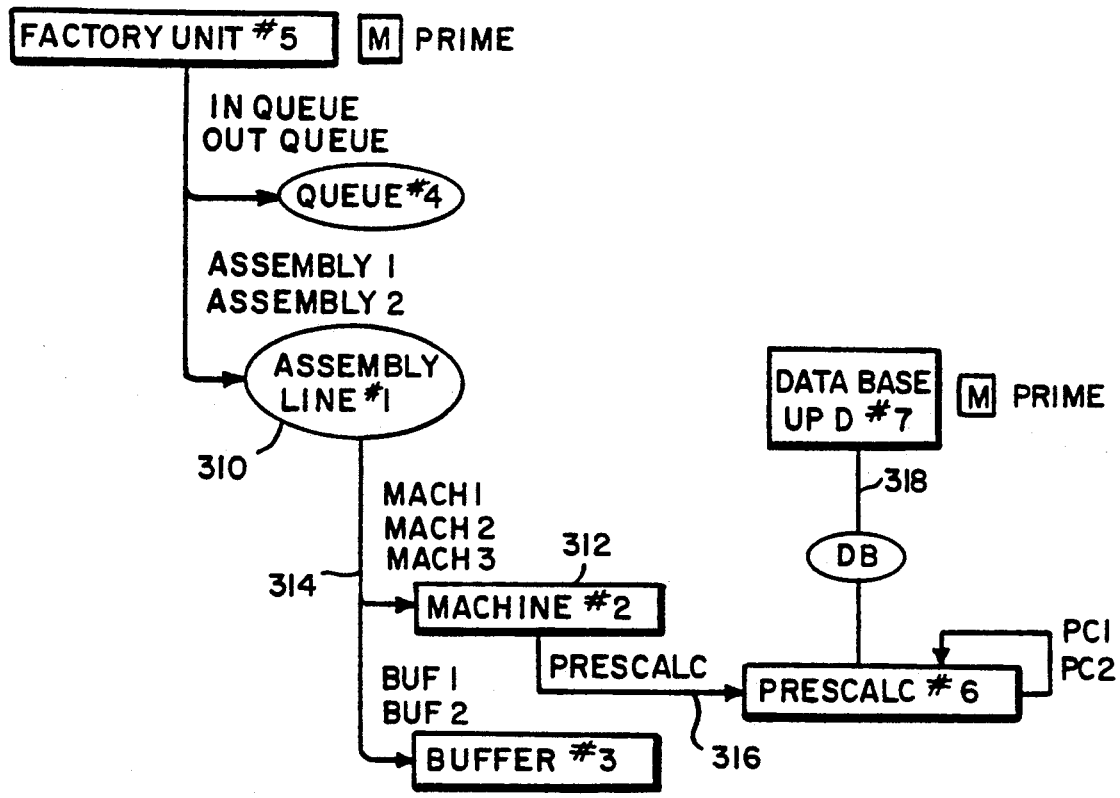
FIG. 22 is a diagrammatic illustration of a page hierarchy diagram.

To get an overview of a given hierarchical CP-net, a graph called a page hierarchy is used. An exemplary page hierarchy appears in FIG. 22, representing the small factory unit of FIG. 10. Each node represents a page and the shape of each such page node tells what kinds of supernodes the page can have. An ellipse shape (e.g., node 310) indicates that all supernodes must be places; a box shape (e.g., node 312) that they must be transitions; and a rounded box shape (e.g., node 314) that there is no restriction. Each arc represents a hierarchical relationship between two pages and the graphics tell whether the arc represents a substitution relationship, an invocation relationship, or a global fusion set. For example, a substitution relationship may be shown by a heavy line, as at 314; an invocation relationship, by a light line, as at 316; and a global fusion set by a textured line, as at 318. Page and instance fusion sets are not represented in the page hierarchy because they involve only a single page. The page hierarchy graph can be generated automatically. The user can, however, change the layout and graphics in any way he might want. The page hierarchy is an integrated part of the user interface. As an example, the user may delete a page by deleting the corresponding page node in the page hierarchy.

To specify the initial state for an execution of a hierarchical CP-net, the user must define a set of starting pages called prime pages. Declaring FactoryUnit#5 to be a prime page means that the execution will start with one instance of FactoryUnit#5, two instances of Queue#4, two instances of AssemblyLine#1, six instances of Machine#2, and four instances of Buffer#3. Instead, AssemblyLine#1 could have been declared to be a prime page and then only a single assembly line would have been indicated, containing one instance of AssemblyLine#1, three instances of Machine#2, and two instances of Buffer#3. In general, the user is allowed to have more than one prime page and he can even let the same page be a multiple prime. Intuitively, the prime pages tell what should be included in the execution. It is, however, also possible, explicitly, to exclude certain pages. If, in the factory unit, Buffer#3 is excluded, no instances will be created for this page and Buf1 and Buf2 will be treated as if they were ordinary places. It is important to be able to include and exclude parts of a model without having to change the model itself.

An elaborate naming scheme is applied for page instances. As an example, consider "(5:Machine#2) Mach2@(2:AssemblyLine#1) Assembly2@(1:FactoryUnit#5)" which denote the fifth instance of Machine #2, which is a subinstance of the transition Mach2 at the second instance of AssemblyLine#1, which, in turn, is a subinstance of the transition Assembly2 at the first instance of FactoryUnit#5. More details about suitable naming schemes, prime pages and exclusion of pages can be found in K. Jensen et al, *CPN Editor: Specification paper for the CPN Palette—Part 3*, Version 1.0, Meta Software Corporation, Cambridge, Mass. 1989 and K. Jensen et al, *CPN Simulator: Specification paper for the CPN Palette—Part 4*, Version 1.0, Meta Software Corporation, Cambridge, Mass. 1989, which are hereby incorporated by reference.

EXAMPLE 5: TELEPHONE SYSTEM

Figure 23:
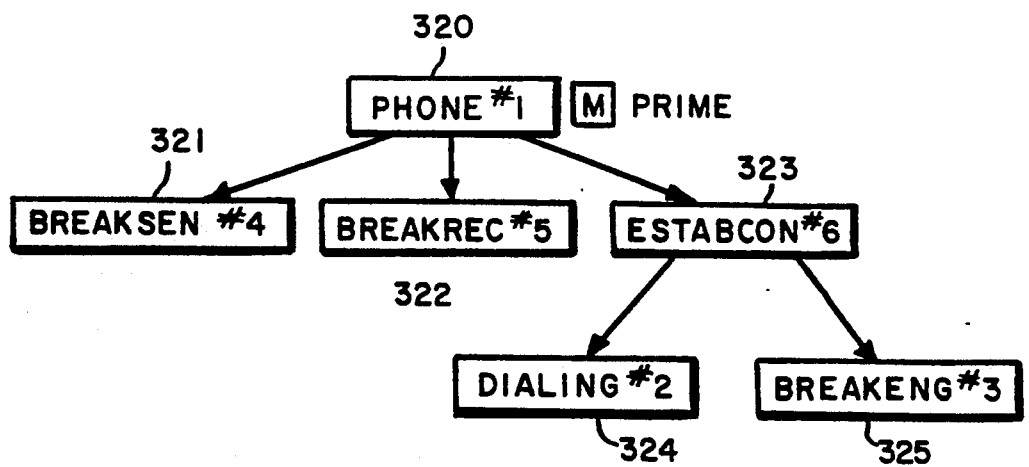
FIG. 23 is a diagrammatic illustration of a page hierarchy for an exemplary telephone system.
Figure 24:
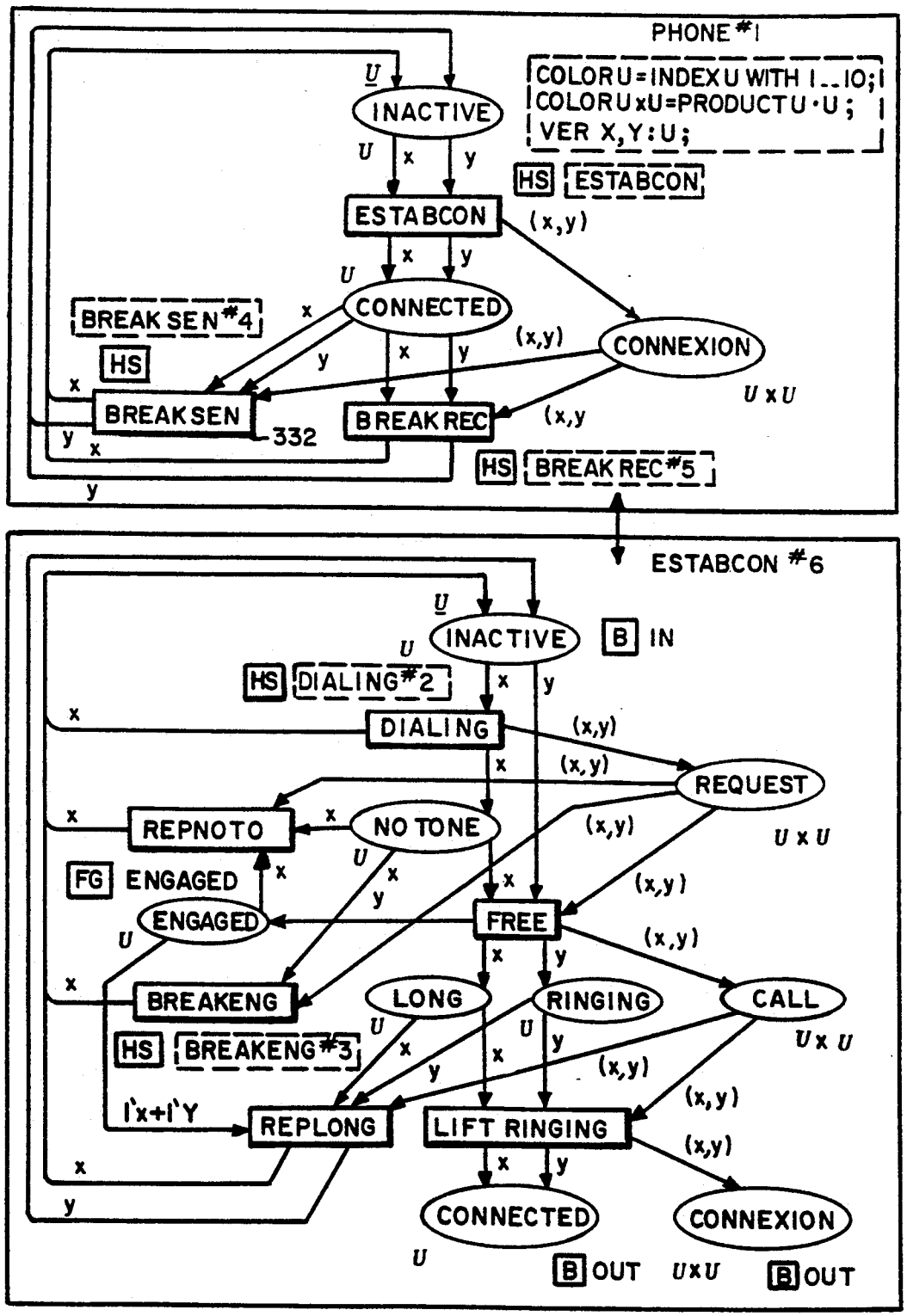
FIGS. 24 and 25 together diagrammatically illustrate the pages of FIG. 23 in greater detail.
Figure 25:
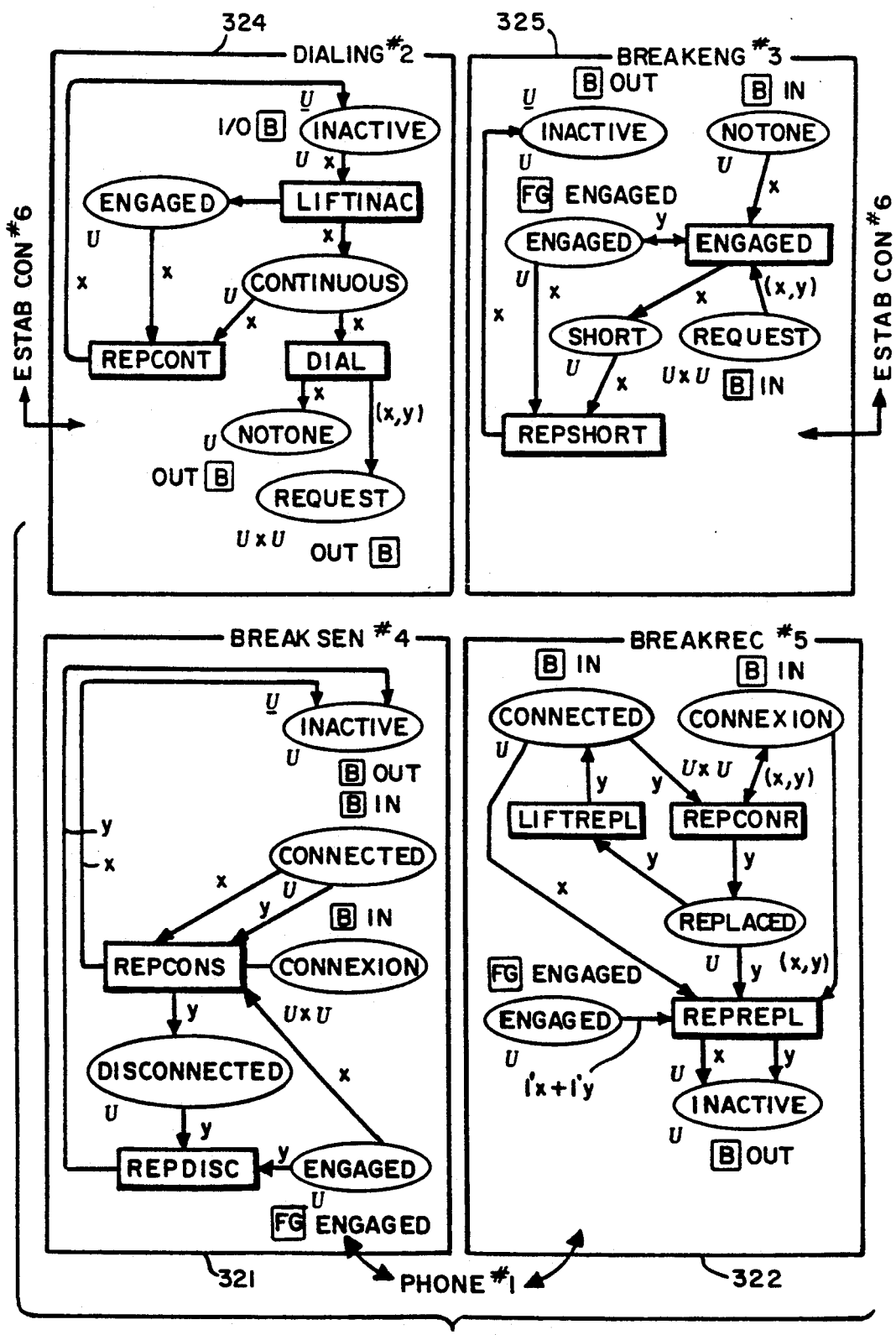

This section presents a hierarchical version of the telephone system from K. Jensen: "Colored Petri Nets" in W. Brauer et al (eds.), *Petri Nets: Central Models and Their Properties, Advances in Petri Nets 1986—Part I, Lecture Notes in Computer Science*, Vol. 254, Springer-Verlag 1987, pp. 248-299, which is incorporated by reference. That system contains a single prime 320 page called Phone#1 (see FIG. 23) and five substitution subpages 321-325. Referring now also to FIGS. 24 and 25, in the original non-hierarchical model, the place Engaged is defined to be complementary to the place Inactive, (and all arcs surrounding Engaged are omitted). In the hierarchical version, Engaged is updated explicitly; to do this, a global fusion set is used, called Engaged.

The arc expressions of the substitution transition BreakSen, 332, at Phone#1 give a slightly less detailed description of the corresponding activity than the subpage BreakSen#4, 321. The substitution transition does not show that the activity has two subactivities (which are executed after each other) and it does not show that Engaged is updated. However, BreakSen still gives the reader a very good idea about what the activity does. It describes the combined effect of the two subactivities on the markings of the socket places.

The arc expressions of the substitution transition EstabCon at Phone #1 are used in another way. They describe what happens in the normal case where a connection is established. However, they do no say that the result of the subpage activities may be that no connection is established (routing both the x and y token to Inactive instead of Connected). It would not have been particularly difficult to describe this possibility in the arc expressions, but the analyst has, at Phone#1, chosen to concentrate on the normal case.

For substitution transitions, the arc expressions at the upper level never influence the execution unless the corresponding subpage is excluded from the execution. However, for substitution places and invocation transitions, this is not always true.

EXAMPLE: DEVELOPMENT AND IMPLEMENTATION OF A STRATEGY FOR ELECTRONIC FUNDS TRANSFER

In this section, we describe as an application of the present invention the development of a system which implements a non-FIFO (first-in-first-out)strategy for electronic funds transfer.

The widespread use of bank-to-bank electronic funds transfer has created the possibility for major financial disruption triggered by the failure of a single banking house. The speed of transaction processing allows banks to execute secondary and tertiary payments based upon expected incoming funds. This is a potential disaster if the payor fails to deliver the cash.

Risk management has been introduced to help control this situation. Payments that would cause debits to exceed present limits are delayed. This in turn reduces the rate of flow of money. Currently this transaction processing is managed by FIFO rules. By looking into a queue of pending transactions and reordering them it is, however, possible to reduce or eliminate the need for excessive debt utilization. Therefore the rate of flow of money can be increased without additional risk.

The electronic bank-to-bank funds transfer is the large electronic payment process that effects the movement of funds between banks primarily through the use of payment networks. The average daily value of the funds transfer is on the order of hundreds of billions of dollars. The recognition of the risk for tremendous losses in case something goes wrong has imposed on the funds transfer a set of limitations on debt utilization, slowing down the rate of flow of money. Still things may go wrong. When a computer failure at a bank required an extension of the business day to correct their systems, the Federal Reserve granted the extension but failed to give notice of the situation. Many banks ended the day in debt since they expected payments which never arrived at their destinations. As a consequence many banks had to buy settlement funding at the end of the day to cover their debts, driving the cost of overnight borrowing far above the norm and producing losses for several institutions.

A new method of processing bank-to-bank transactions has been needed. This method must incorporate all the limits and self-regulations that the market and the relevant government institutions have imposed. At the same time, it must make better use of capital resources of banks and produce a lower average debt, reducing the inherent risks. Then it will be used to process the day's business in advance in two ways: first by predicting the debt positions as the day evolves and second by determining in what sequence the payments should be executed. This new method is decomposed into three major activities: Source Data Management, Debt Simulation Modelling and Debt Management.

In the Source Data Management activity, all necessary data is collected and pre-processed. The payments are collected from the originating business areas and split into two subsets: (1) the "actuals" set, composed of transactions that have already been executed through the networks and that update the current debt position; and (2) the futures set, composed of transactions that still have to be processed.

Three distinct debt-positions must also be available: (1) the customer balance, which limits the amount of funds that may be withdrawn from a customer of the bank; (2) the bilateral balance, which limits the debt that each bank will accept from another bilateral agreements; and (3) the network balance, which limits the overall debt any institution may have within the CHIPS (Clearing House Interbank Payment System, built and supported by approximately 140 banks and used primarily for international dollar payments) and the FED-WIRE (built and supported by the U.S. Federal Reserve Bank and used primarily for U.S. domestic payments) networks, alone or cross-checked.

The futures set can be evaluated to determine (a) the transactions for which the expiration date is close, in which case they will be processed immediately, and (b) the set of transactions that have not reached their expiration dates. Since the number of payments that can be executed every hour is limited by the network characteristics, the rate of flow of money can be increased by grouping together transactions with similar characteristics, such as the debit and credit parties. Also the net result of incoming and outgoing payments with similar characteristics may be calculated, reducing the amount of money that travels through the networks.

Figure 26:
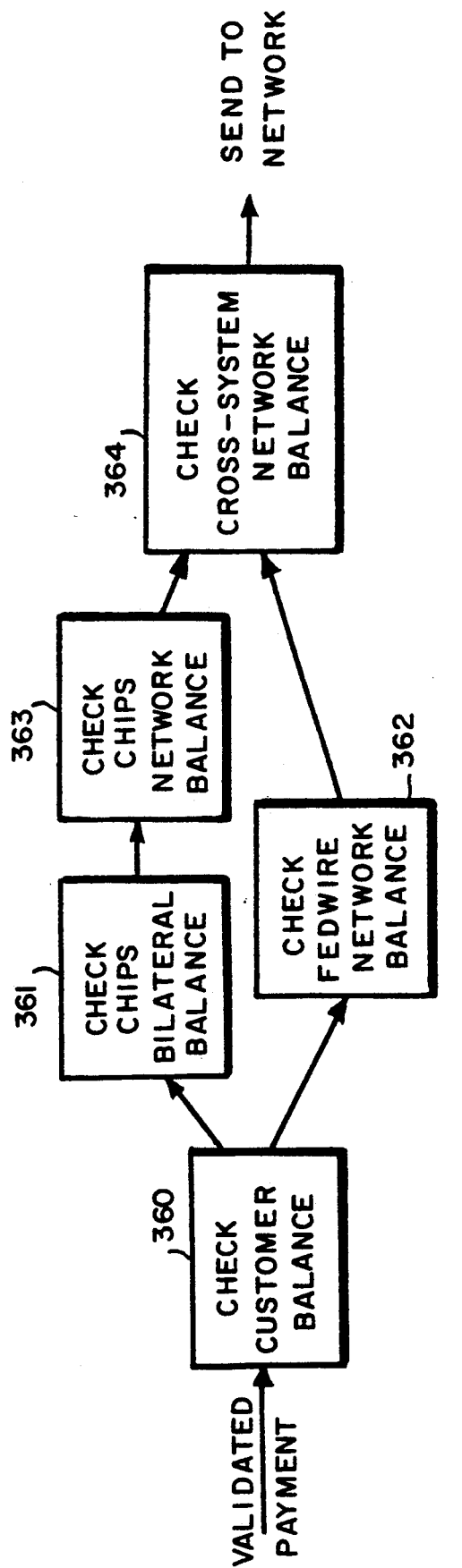
FIG. 26 is a simplified flow chart of a banking system in which payment transactions are checked against different limits before being transacted over an interbank network.

In the Debt Simulation Modeling activity, several criteria have been proposed for sequencing the transactions with the objective of reducing the average debt. Then the transactions are checked against the three limits (customer, bilateral and network) previously mentioned. Different payments need to be checked against different limits 360-364 before a payment can be transacted over the network. See FIG. 26.

In the Debt Management activity, the payments that exceed the limits are processed. These payments generate exceptions that can be overridden on the basis, for example, of an expected receivable. If an exception is overridden, then it is re inserted into the list of payments that are being processed. If the exception is not overridden then the payment that generated it will not be executed at that time.

When all payments have been checked, a "debt" plan is produced. This debt plan can be reviewed and proposed as the script for executing transfers. AAlternatively, some of the parameters that control the method may be changed, such as the sequencing scheme, so that a different debt plan will be produced.

This new method was originally specified using SADT and it is referred to as the Manage Intraday Debt SADT model (MID-SADT). The MID SADT model was then converted into a CPN model (MID-CPN) for simulation. The MID-CPN model was then used to generate a production version of the system.

Methodologies and Software Tool

SADT (Structured Analysis and Design Technique) is a graphic notation and an approach to system description. SADT models show all activities that compose the system, their inter-connections, the way they exchange data and how they exercise control on each other.

The SADT methodology is not usually considered adequate for direct representation of executable models (i.e., programs). The arrow structure it uses is intentionally ambiguous in respect to the representation of such concepts as concurrency and choice, these being regarded as implementation details to be left unspecified until needed. The activation rules by which the detailed behavior of undecomposed activities is specified are too primitive and a formal theory of behavior based on these rules has not been elaborated.

Since it is possible to test the behavior of a CPN model through simulation, the model is executable. Therefore the CPN methodology, unlike SADT, is not used only to build system specifications but also to validate a system's design through simulation and other more formal kinds of analysis.

In short, CPN is a programming methodology and system with which executable models can be built. At the same time, CP-nets are not usually considered adequate for directly executing the production version of the system under development. This happens because the high-level interactive graphical programming environment limits the efficiency of the execution.

Standard ML (SML) is a functional programming language in which the total behavior of a system is encoded into a textual representation and no use is made of any kind of graphical object. It is used to build production versions of CP-net models.

SADT models can be converted into equivalent CPN models, with similar graphical lay-out, where detailed behavioral modelling is possible. Moreover, problems related to concurrency and choice, non-specified in the SADT model, can be addressed properly with CPN inscriptions. These inscriptions can also be added directly to the SADT model, so that it is possible to convert it and execute the resulting CPN model. The conversion process can be hidden from the end-user, so that the SADT model becomes executable, where the behavior is still defined by the underlying CPN model.

CPN models can, in their turn, be converted into "pure" SML applications. The basic idea here is to eliminate the entire CPN graphical representation without eliminating its computational semantic. The net structure that regulates the CPN execution can be completely hidden from the end-user so that a different interface system can be built.

The task of specifying, simulating, prototyping and implementing the new method for Intraday Debt Management is historically divided into four parts, or phases.

In the first phase, an SADT model called the "MID-SADT" model, portraying the new method of managing intraday debt, was built. The SADT methodology was chosen, at this stage, because of its very simple semantics and its "loose" syntax; both were believed to be easy to learn by the bank managers responsible for the creation of the model. After some interaction between SADT-trained users and experts of the banking community, in which the structure of the CPN model called the MID-SADT model was improved, it was automatically converted into a CPN model.

In the second phase, the generation of a CPN model called the "MID-CPN" model was commenced through an automatic conversion of the MID-SADT model. In the development of this first prototype, the basic data structures of the model were defined in terms of color sets and the basic operations to be performed on this data were specified in terms of arc inscriptions, guards and code segments. Since the purpose of this initial phase was to validate the logic of the net structure of the model, not too much effort was put into the process of specifying all the details of both the color sets and the net inscriptions. Nevertheless, all of the most important functions of the model were written at the level of detail considered to be relevant. This model was then validated.

In the third phase, construction of the final MID-CPN model was achieved by making a detailed analysis of the data that flows within the model, together with a more appropriate description of the operations to be performed on this data. The color sets then became a real description of all the data that is needed in order for the model to execute properly. Several databases were modelled with color sets to represent customers balances, network balances and agreements on netting operations. Since the purpose of this phase was no longer the validation of the logic of the model but, rather, the validation of the computational results, most of the effort was put into the writing and testing of the SML code (i.e., of the inscriptions of the CPN model). The validation of this model was done in a week. During this phase a serious design error in the SADT model was discovered. The discovery of this error required changes in both the MID-SADT and MID-CPN models. These changes took only three days to implement, thanks to the flexibility and locality properties of the models used for the specification and development processes.

In the fourth phase, an SML application was built as a prototype of the final production version of the system. This prototype was first produced in a manual fashion. Then a simple algorithm for generating the SML application automatically from the MID-CPN model was implemented.

In the manual conversion process, all the SML code that was written and tested in the final MID-CPN model is structured in such a way that its execution reproduces the same behavior as the MID-CPN model. This process was very straightforward since, for the MID-CPN model, a fixed sequence of transitions that correspond to a desired behavior can be found. Therefore the SML code that is executed within this sequence can be easily stripped out from its CPN environment. The applicability of this method is limited, since it depends on the complexity of the model to be manually converted.

In the automatic conversion process the SML application was generated automatically from the final MID-CPN model. The details of this process are described below.

Figure 32:
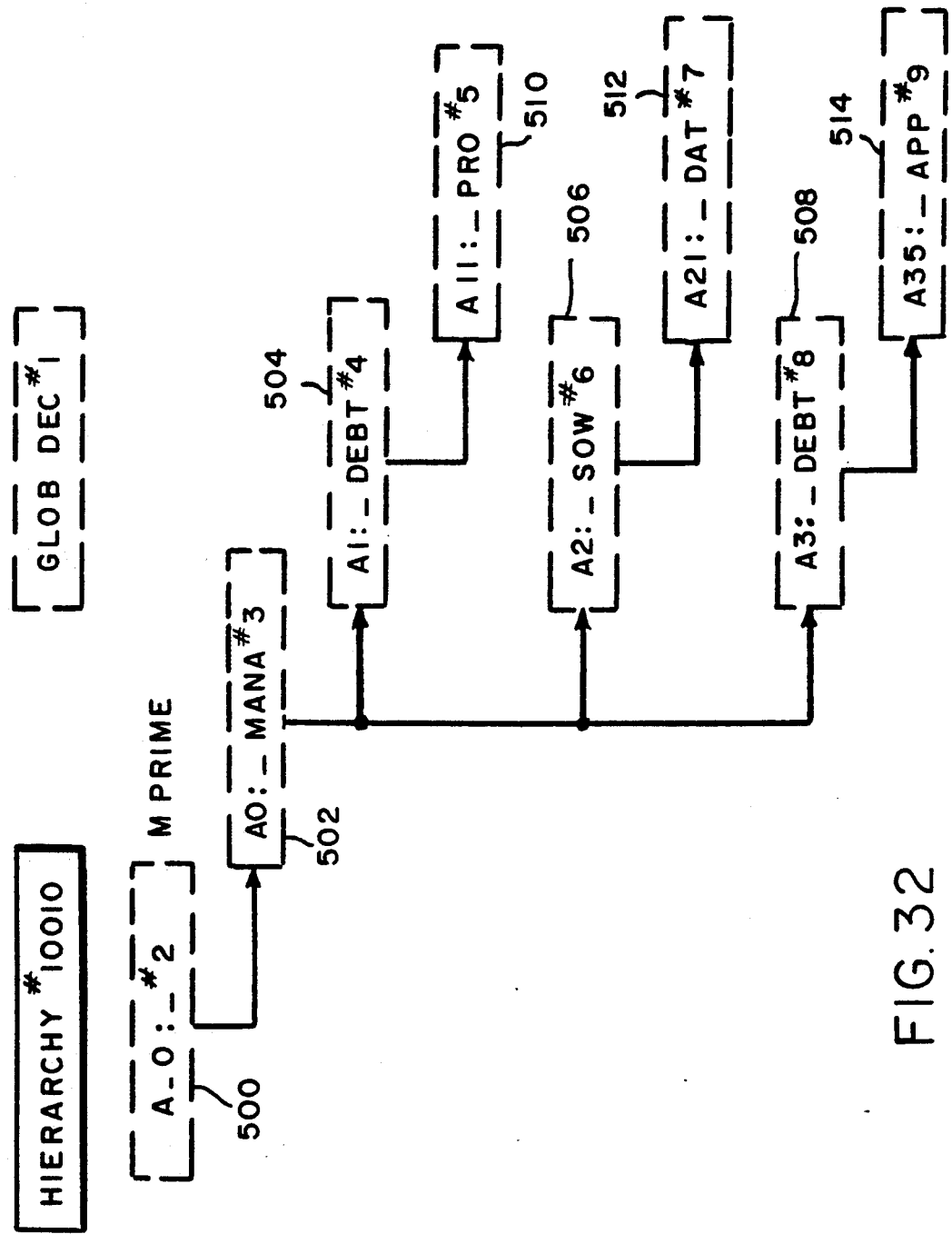
FIG. 32 is a hierarchy page diagram of the MID-CPN model discussed herein.

As a result of the conversion process from the initial SADT model, the net structure of the MID CPN model is hierarchical, with three levels of decomposition. There are a total of 8 pages, plus a separate page containing the color set declarations and the SML functions. On these pages there are twenty-four non-decomposed transitions (i.e., transitions that do not have a subpages that replaces them). A diagram (called a Hierarchy Page) showing the hierarchical relationships between the pages of the model is presented in FIG. 32, which is discussed below.

In the case cf the MID model, the input data for the model can be described as a list of bank-to-bank transactions. Transactions are characterized by the identification number, the originating business area, the method of payment, the day and hour at which they are due (i.e. the deadline), the amount, the debit and credit parties.

The set of bank-to-bank transactions is defined as a list of individual payments:
color TransLists=list Trans;
The payments are defined as records with labeled fields:
color    Trans=recordiD:String*DealTypeE:DealType*PaymeT:Paymet*    DeadlinE:Deadline*AmounT:Real*DebtiD:String*CrediD:String;
The originating business areas are defined as elements of an enumerative set:
color DealType=with CUST/TREAS/OTHER;
The transactions method (i.e. which network the payment is going to be sent through) and the type (credit or debit) are also defined as elements of an enumerative set:
color Paymet=with BOOK/CHIPOUT/FEDOUT/-CHIPIN/DEDIN;
The transaction deadline is defined as a record with a date and a time field:
color Deadline=record DatE:Date*TimE:Time;
where the individual fields are defined as follows:
color Tflag=with am/pm;
color Time=record Hour:Int*Min:Int*TflaG:Tflaq;
color Date=record Month:Int*Day:Int*Year:Int;
Agreements between banks for grouping more than one transaction together into a single payment are defined as records:
color Agreements=record PartiD:String*DealTypE:-DealType* ChipAgR:Bank__AgrList* FedAgR:Bank__AgrList;
Two of the fields of this record are indeed lists of records to provide the possibility of expressing agreements in which one bank, with respect to a specific bank and a specific business area, agrees to net only the payments in a specific time frame (e.g., from 10:00 a.m. to 2:00 p.m.) to a limited extent (e.g., $1,000,000.00):

color Bank_Agreements=record lower:String*higher:String*AmounT:Real;
color Bank_AgrList=list Bank_Agreements;
Payments that do not pass limits (exceptions) are represented as a product set between an enumerative set that establishes which of the limits were not passed and the list of payments:
color ExType=with INT/BILAT/CHIPCAP/FEDCAP/XCAP;
color Internal_External_Credit_and_Cap_Exceptions=product ExType*TransList;
In the CPN model, many color sets are conceptually of the same data type but have different names. This happens because the color set names are inherited from the labels of the SADT model, where, for example, in different parts of the model lists of transactions are referred to as Transactions Within Measurement Period or Transactions Outside Measurement Period or Executed Transactions. Many of the color sets are therefore duplicate color sets, i.e., defined in terms of a previously defined color set, as in the following case:
color Executed_Transactions=TransList;
In the final verison of the MID CPN model, there were thirty-five unduplicated colors of which six are of type unit (i.e., single valued) and twenty-nine are duplicate colors. Most of the colors are a combination of lists, records and enumerations, although some products and some subranges of integers were used as well.

Variables of a given color set, to be used in arc expressions, guards and code segments, are defined in a programming language fashion, as in the following example:
var interlist, intralist:Intraday_Posts;
The color set declarations, the variable declaration and the user defined SML functions that are used in the inscriptions of the CP-net, are placed in special objects, called declaration nodes.

Arc Expressions and Code Segments

In the MID model, on most input-arc-expressions there are variables of a given color set while on most output-arc-expressions there are SML functions applied to the input variables or there are variables whose value is calculated within a guard or a code segment. Examine the exemplary transition 400 shown in FIG. 27.

This transition performs a very simple load input operation, reading from an external file and converting it into a list of transactions. The presence of the initial marking ( ), 402, of color unit, 404, on the input place 406 enables this transition 400 to occur as soon as the simulation begins. When the transition occurs, the variable u of type unit is bound to the value ( ), (in order to the match the initial marking) thus removing the token from the input place. The values for the tokens on the output arcs are calculated by the execution of the code segment 408. The output clause of the code segment determines which variables calculated within the code segment will be bound to the corresponding variables on the surrounding output arcs. The action clause of the code segment determines how the output values are calculated. In this particular case, two lines of SML code perform the desired effect: first a reference variable infile of type instream (i.e., a pointer to an input file) is associated with a specific file in the system file (FUTURES). The complete pathname of the file is specified within the variable CUR_DIR. The second line of code applies two functions to this reference variable, thus generating a value for interlist.

Also consider the transition 410 shown in FIG. 28. This transition performs a split of two lists of incoming transactions, interlist and intralist, into two lists: one representing the transactions that have not yet been executed (the futures) and one representing those that have already been executed (the actuals). In order for transition 410 to occur, tokens must be sitting on the two input places 412 and 414. After the occurrence of the transitions that load the input files with all the transactions to be processed, this transition will be enabled. When the transition 410 occurs, the variables on the input-arc-expressions (intralist, interlist) will be bound to the respective tokens that hold the lists of incoming transactions, thus removing them from the input places. The values for the tokens that will be put on the output places 416 and 418 are calculated by the output-arc-expressions. These are ML functions that evaluate into the appropriate color sets:
val Actual: Intraday_Posts→Executed_Transactions
val Future: Intraday_Posts→Bulk_Transaction_Information
Using the appropriate SML notation, these functions can be defined as follows:
fun Future nil=[ ]
/ Future ((x:TempTrans)::xs)=if #TrTypE x=FUTURE then #TranSx::Future(xs) else Future(xs);
(*"generates the list of future transactions"*)
fun actual nil=[ ]
/ Actual ((x:TempTrans)::xs)=if #TrTypE x=ACTUAL then #TranSx::Actual(xs) else Actual(xs);
(*"generates the list of actual transactions"*)
If the function is not of the appropriate type, an error will be generated during a syntax check, and not during run-time. Each function is defined in two separate clauses (the symmetry of the functions can be noticed). The first clause handles the case of the empty list applying a pattern match (e.g., fun Future nil =[ ]). The second clause looks at the type of the transaction and decides whether it should insert it in its recursive call. In this way, the Future function will produce a list containing only futures and the Actual function will produce a list containing only actuals.

Since the input lists are scanned twice to generate the actual and future lists, the efficiency of the previous transition can be improved, as shown in FIG. 29.

The values for the tokens that will be put on the output places are now calculated by the execution of the code segment 420. The input clause determines which variables on the surrounding input arcs will be used in the code segment. The input clause 422 determines which variables on the surrounding input arcs will be used in the code segment. The output clause 424 determines which variables calculated within the code segment will be bound to the corresponding variables on the surrounding output arcs. The action clause 426 of the code segment determines how the output values are calculated. In this particular case, the values for the variables on the output clause are calculated by the following SML function:
val Split_Exp_Act=fn:(TempTrans list)→((Trans list)) defined as:
local fun Loc_Split_Exp_Act (nil,exp,act)=(exp,act)
/ Loc_Split_Exp_Act ((x:TempTrans)::xs,exp,act)=
if #TrTypE x=FUTURE
then Loc_Split_Exp_Act(xs,#TranS x::exp,act)
else Loc_Split_Exp_Act(xs,exp,#TranS x::act);

in fun split_Exp_Act 1=Loc_Split_Exp_Act(1,[ ],[ ]) end;

This function now returns two lists and is defined in terms of a function that inserts the transactions in its second argument if the payment is a future, or in its third argument if the payment is an actual. The first clause of the local function returns the complete lists of actuals and futures, when the input becomes empty.

Syntax Checking

A variety of syntax checks are performed to ensure that the net is "wired" validly. The following list is not exhausted of the possible checks, but is exemplary.

First, the syntax check verifies that for the overall model, there is exactly one global definition node and at most one temporary local definition node.

Second, ports assignments are checked for connecting submodels, to ensure that ports and sockets match up.

Third, a test is performed to verify, for each submodel, that there is at most one global declaration node (which contains the color set definitions).

Fourth, it is verified that fused places have the same color set.

Fifth, for each fusion set, it is confirmed that the fusion set members share the same marking.

Sixth, all markings are checked to ensure that they evaluate to the proper type.

Seventh, for all places which are not fusion set members, a check is made to ensure that there exists a defined color set.

Eighth, for such places, the initial marking is verified to be of the proper type, as specified by the color set.

Ninth, for transitions, a check is made to ensure that the associated code segment use of variables is correct, using only variables from input arcs and generating only values for variables appearing on output arcs.

Tenth, the guards are examined to verigy that all component expressions evaluate to Boolean values.

Eleventh, the syntax of each arc expression is checked, to confirm the expression evaluates to the proper type.

Twelvth, the syntax of each code segment is checked.

Thirteenth, for every compound transition, it is verified that all socket places are assigned to ports, and that the color sets are consistent for sockets and ports.

SML Functions

SML functions play a major role in the development of the MID-CPN model since most of the detailed behavior associated with the occurrence of the transition is specified as SML code.

The definition of this code and its individual testing can be done independently of the CPN model execution, using an SML interpreter as a code evaluator. During this kind of testing, referred to above as syntax checking, the functionality of the code is checked so that it evaluates to the color sets of the places connected to the arcs where the function will be used.

It is also interesting to note that the behavior of the model can easily be changed by modifying the definition of the SML functions with relatively little changes to the net structure (or in many cases none). Consider the example of FIG. 30.

In that case, the sequencing of the transactions is being modelled. At one point of the model's execution, two tokens (holding different lists of transactions) will be sitting on each one of the input places 432 and 434, thus enabling the transition 435 to occur. The value for the token that is produced from the occurrence of the transition is calculated by the output-arc-expression. This consists of a SML function that evaluates from a list of transactions to a list of transactions and can be defined, especially in the case of a rough prototype, like this:

fun Sequence (x:TransList)=x;

which corresponds to a FIFO ordering scheme.

Figures 30, 31:
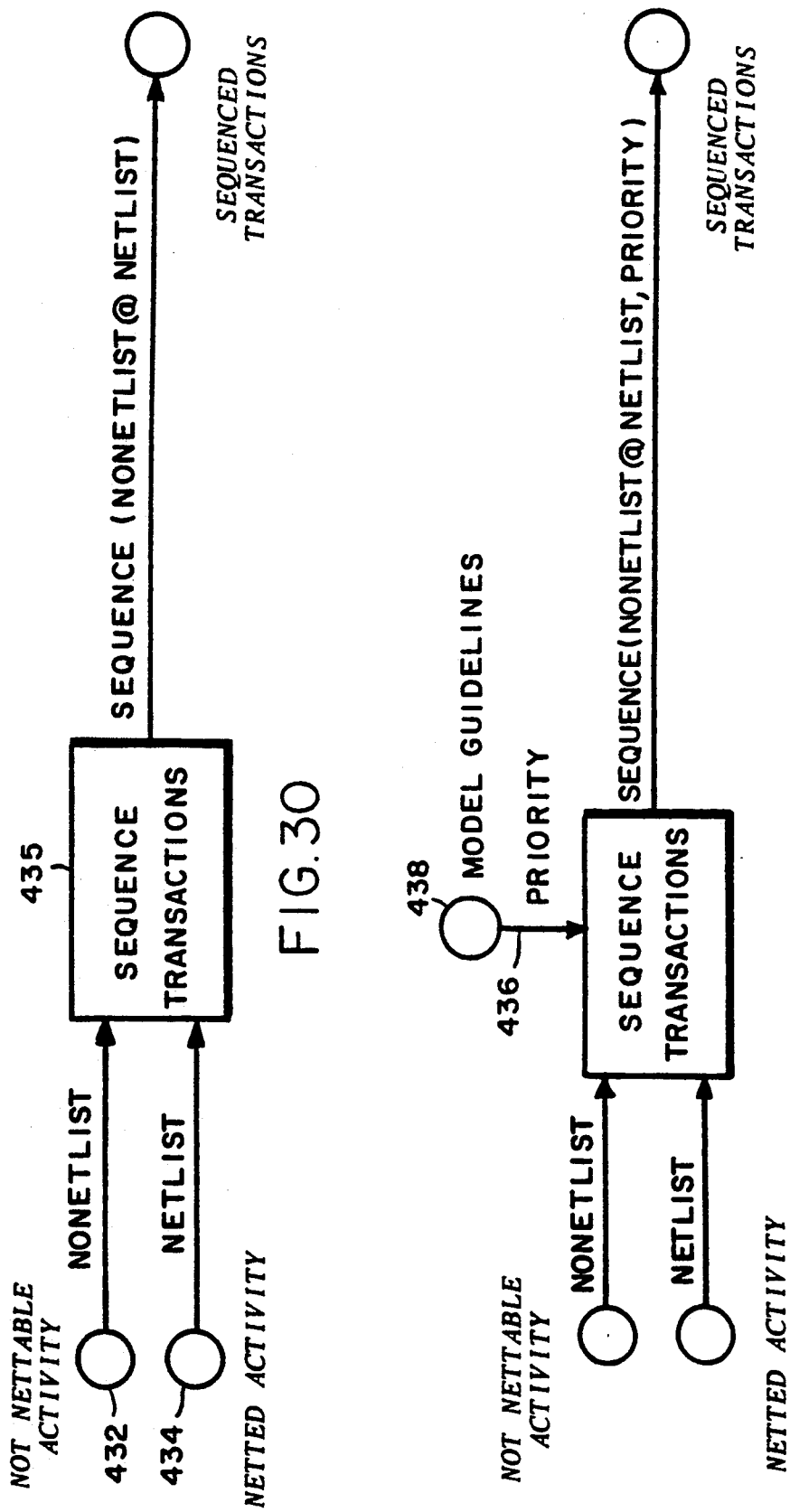
FIG. 30 is a diagrammatic illustration of a net modelling the sequencing of transactions in the banking system model.
FIG. 31 is a diagrammatic illustration of a possible modification of the net of FIG. 30.

With no changes to the net structure, the function can be redefined so that it performs a complex ordering scheme based on type of transaction and amount. Then by adding one arc 437 and one place 438 many different sequencing schemes can be implemented, as shown in FIG. 31.

Note that the functionality of the Sequence function has changed because of the priority parameter.

During the development of the MID-CPN model, progressive extensions made to the SML code have produced nearly 1300 lines of SML function declarations, while the size of the model in terms of number of pages (9-10) and number of transitions (20-24), has been relatively stable during the whole modelling process.

It should be clear that the major difference between the second and third phases of the project is mainly in the volume and accuracy of the SML code written. This introduces the idea of progressively shifting interest, during the evolution of the project, from a more graphical interaction with the model, in which the behavior is displayed interms of the occurrence sequences, to a less graphical and more batch-oriented interaction, in which the interest is in the results of the occurrence of the transitions. These results become far too complex to be conveniently inspected in the form of token contents, so that it is necessary to display them in a more adequate fashion. It is then easy to print them on output files that can subsequently be analyzed and/or to display them in dialog boxes with the desired format.

Simulation and Code Generation

So far, we have described the role played by the net inscriptions in specifying the behavior of the MID-CPN model. Our interest is now in the study and validation of the model through simulation, and ultimately in building a production version of it. Two ways in which we built a production version of the MID-CPN model are presented; one we shall call manual code generation and the other, automatic code generation.

Interactive graphical simulation; manual and automatic modes

Interactive graphical simulation of the MID-CPN model started with the testing of the individual transitions in a manual fashion. Several bindings for the transitions were inspected at this stage and the occurrence sets (the sets of transitions to be fired) were selected manually.

After the correctness of the individual transitions was checked, the model was tested in automatic mode. In this simulation mode, random choices are made of which enabled transitions should occur.

The focus of the simulation was then to find out whether the logic of the model satisfied the modeller's expectations, in terms of resource sharing, synchronization, etc. The main interest was therefore to observe the token flow within the model. As input data for the simulation, a few transactions (maximum 50-100) were used and in some case none (i.e., empty lists), since the occurrence sequence of this model does not change by using a large or small number of transactions as input data.

Building a production version manually

Once the model was validated, the concerns were of a different nature. The speed of the transaction processing in the simulator was too slow to make it useful in real time. The number of transactions that are processed every day in the real world is between 10,000 and 30,000 depending on the particular institution, and for an application to be of practical use it must process them at least once in less then 15 minutes.

A production version of the CPN model was therefore created. This application, a Standard ML program, was created in less than a week by a single person. Most of the time was spent doing tests and the application itself was built in less than a day.

This SML program, the MID-ML program, was based on a fixed transition occurrence sequence recorded during simulation. Since all events in the MID-CPN model occurred in this sequence, it is possible to strip out all the enabling calculation and occurrence set calculations by writing appropriate SML code.

Every transition of the MID-CPN model was then manually converted into a sequence of SML instructions.

For example, the transition 400 that loads the Interday Posts (see FIG. 27) is written using SML syntax in the following way:
val infile=open_in (CUR_DIR' "FUTURES");
val interlist=(GetList GetTrans) (infile);
and the transition 410 that inputs transactions expected and orders (FIG. 29) are written in the following way:
val (futurelist,actuallist)=Split_Exp_Act (interlist-@intralist);

This process of associating every transition with SML code leads to the creation of an equivalent SML application of approximately an extra 100 lines, many of which deal with input and output of data while the core of the application consists of 30 lines. With this compact code, a very large number of transactions can be executed in the available time. In about 9.33 minutes, 11,698 transactions were run with an SML compiler on a dedicated SUN SPARC server (from Sun Microsystems, Inc.) with 32 MB RAM memory. Three minutes were consumed by the input operation of loading the transactions, two minutes were spent to process them and four minutes and 20 seconds are spent writing output files. These contain all the information concerning which transactions were netted together, how the payments were sequenced, which exceptions were generated and much more. Of this total output time, 50 seconds were spent writing the proposed script for the next transfer and writing the updated position database.

Building a production version automatically

By contrast, the production verison of a CPN model such as the MID-CPN model can be built automatically from the Meta Software Corporation (Cambridge, Mass.) Design/CPN tool in a few minutes. This is particularly useful in those cases in which it would be very complicated to manually produce the code, as when the CPN model has several hundred transitions. This is made possible by the existence of a number of SML functions that are built for every transition in a given model. These functions remove tokens, execute code actions, generate new tokens and update the current markings.

In the manual/automatic simulation, the execution of these functions is driven by the graphical interface which, in order to provide user feed-back on the enabled transitions, the markings, and so forth, executes them in a very fragmented way. This means that their execution is interrupted continuously to send results to the graphical interface that displays them in the form of tokens being removed from the input places and committed to a binding, and tokens added to the output places, and so forth. Nevertheless, the execution of these functions isolated from this interface produces performance results that are exactly the same as those for the manually produced code.

Therefore it is possible to generate a SML application which executes all these functions without being interrupted by the requests of the graphical interface. This SML application can be executed both as an independent application or still within the CPN graphical interface. The process generating such an application can be viewed as a CPN compilation facility in which models and sub-models can be compiled into executable code.

In order to compile a model, an occurrence sequence must be chosen by the user or by the simulator/compiler. These occurrence sequence determines the order in which the compiled model will attempt to execute its transitions.

If the simulator/compiler chooses the occurrence sequence, the generated SML code will try to execute every transition in the compiled net once in every step according to some order. If the user specifies the occurrence sequence, the generated SML code will try to execute every transition in the compiled net once in every step according to the order specified by the user.

If a binding cannot be found for any of the transitions, then the execution will quit since there are no more enabled transitions. In any case, the user can specify the number of compiled steps he wants to execute.

On the top of page A-O (500) of the MID-CPN model (see FIG. 32), the input data is loaded into the system. The activity of managing intraday debt is represented at this level as a substitution transition replaced by page A0, 502.

On page 502, the three major activities of the new strategy for intraday debt management are also represented as substitution transitions: A1, 504, for Debt Management; A2, 506, for Source Data Management; A3, 508, for Debt Simulation Model.

On page 504 the decisions concerning the handling of the exceptions (i.e. payments that fail to pass limits) are modelled. The transition that processes these credit decisions is replaced by page 510, A11.

On page 510 the credit decisions that contributed to generate the current debt plan are reviewed. Transitions that enable the user to change the model guidelines, like the selection of a sequencing scheme, are modelled on this page.

Figure 33:
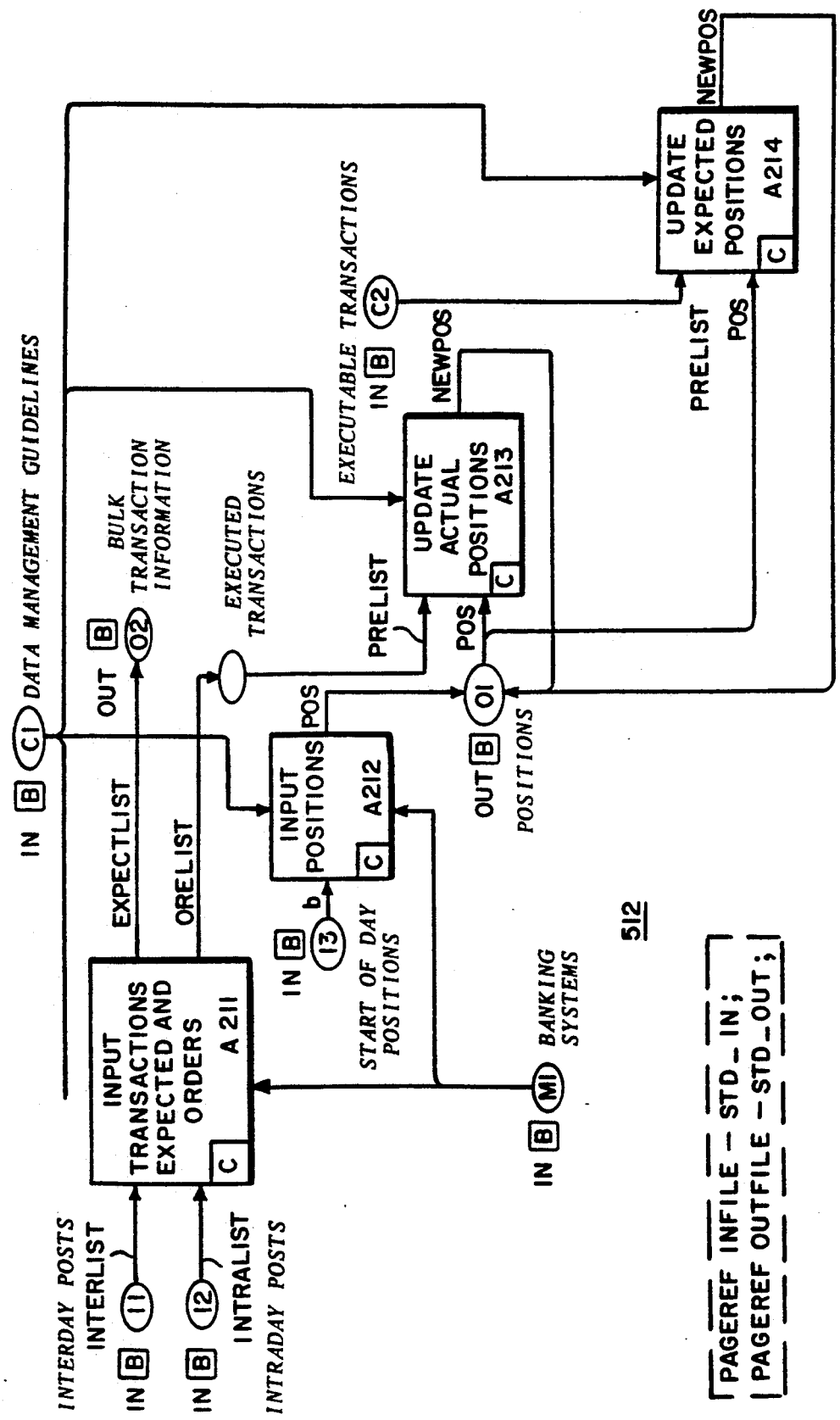
FIG. 33 is an expanded diagrammatic illustration of pages 512 FIG. 32, at the next level of the net hierarchy.

On page A21, 512 (expanded in FIG. 33), the database that holds the debt positions is loaded in the model. The lists of transactions are split into the set of futures and actuals and the updating of the database takes place.

Figure 34:
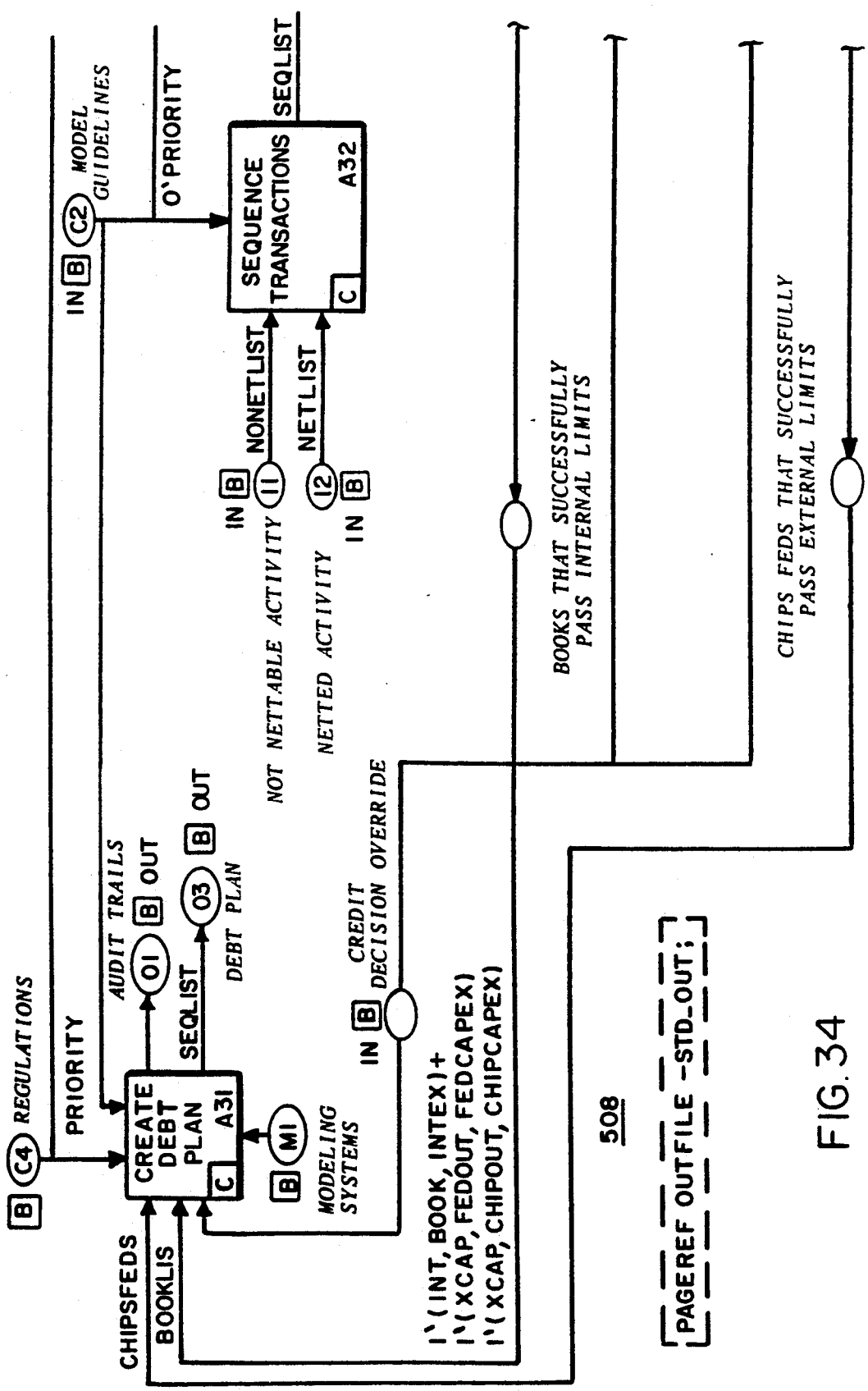
FIG. 34 is an expanded diagrammatic illustration of page 508 of FIG. 32, at the next level of the net hierarchy.
Figure 34:
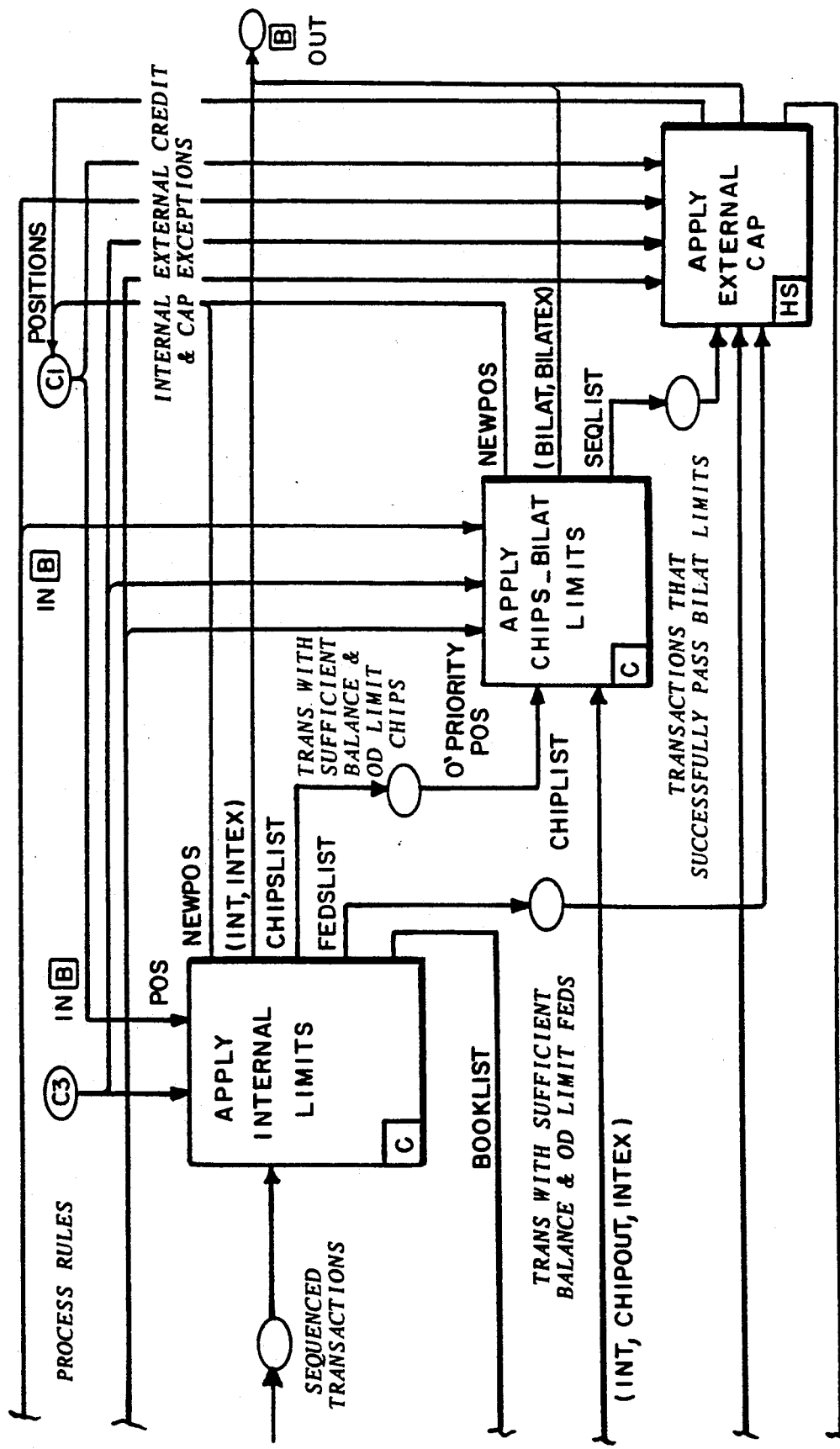

On page 508, A3 (expanded in FIG. 34), payments are sequenced according to a previously chosen priority scheme. Then the limit checking begins. The application of the internal limits and the CHIP bilateral limit are modelled on this page while the application of the external caps is modelled on page 514, A35. The creation of a debt plan is also modelled on page 508.

On page 514, A35, the application of the FEDWIRE cap, the CHIPS cap the cross-systems cap are modelled.

Having thus described the basic concept of the invention, it will be readily apparent to those skilled in the art that the foregoing detailed disclosure is intended to be presented by way of example only, and is not limiting. Various alterations, improvements, and modifications will occur and are intended to those skilled in the art, though not expressly stated herein. These modifications, alterations, and improvements are intended to be suggested to be suggested hereby, and are within the spirit and scope of the invention. Accordingly, the invention is limited only by the following claims and equivalents thereto:

What is claimed is:

1. In a method for using a digital computer to generate, responsive to graphical input, a computer program constituting an executable model of a system represented by a plurality of Petri nets which in turn are represented to the computer as one or more data bases of known structure, each Petri net being assembled from places, transitions, arcs, arc-expressions which are related in terms of variables, arc inscriptions, tokens and other constituent elements, each such constituent element being represented in the data bases by appropriate computer program code, said model being executable to allow both analysis and simulation of said system, the steps of operating the computer to:
   a. determine whether there are any unbound variables in the nets and, if not, proceeding with step j, but otherwise proceeding with step b;
   b. determine whether there are any unprocessed input arcs and, if not, skipping to step g;
   c. select an unprocessed input arc;
   d. substitute for all bound variables occurring in an input arc-expression corresponding to the selected input arc the values to which those variables are bound;
   e. perform any function applications that may now be carried out;
   f. pattern-match said input arc-expression against each of the tokens in a current marking of a selected input place associated with the corresponding selected input arc, and
      (i) if any constants and/or already bound variables in the arc-expression are incompatible with the current marking, to return a failure message, and continue processing with step b but treating a previously bound variable as now unbound,
      (ii) if the arc-expression contains function applications (including infix operators) which cannot yet be evaluated due to the presence of unbound variables, to mark and ignore the arc-expression, and continue processing with step b,
      (iii) if the pattern match succeeds, to add newly bound variables to a proposed binding, recursively calling steps b-f for each matchable value and for each match found, to return a success message and continuing with step g, but otherwise to return a failure message and return to step a;
   g. check each marked arc-expression to determine if it is now evaluable and, if so, to branch to step a and repeating steps a-f until there are no more unbound variables or no more evaluable arc expressions;
   h. determine, if there are no evaluable marked arc-expressions, for each still-unbound variable, whether the variable (a) only occurs in output arc expressions or (b) occurs in input arc expressions that are marked and remain unevaluable;
   i. generate for the latter, if the variable is of a color set (i.e. type) with only a small number of values, a possible binding as if there had been a match, and if the variable is of a large color set, to generate a possible value by a random selection; and
   j. evaluate arc functions.

2. In apparatus useful for machine-assisted programming to generate, using a digital computer having a processor and memory, a computer program which is executable to analyze or simulate a system which is being represented by a plurality of Petri nets, comprising:
   a. means for storing in the computer memory a data structure representing each Petri net, including codings representing each transition, place, token, arc, variable and arc-expression in each net;
   b. means for determining, from the data structure, whether there are any unbound variables in the nets;
   c. means for determining whether there are any unprocessed input arcs in the system;
   c. means responsive to the means for determining whether there are any unprocessed input arcs, for selecting an unprocessed input arc from the data structure;
   d. means responsive to said selected unprocessed input arc for storing, for all bound variables occurring in corresponding input arc-expressions, the values to which each input arc-expression in bound;
   e. means for determining and executing any function application that may be executed once the bound values of said input arc-expressions are stored;
   f. means for pattern-matching each of said corresponding arc-expressions against each of the tokens in a current marking of a selected input place associated with the selected input arc, and for (1) returning a failure message and recommencing the search one node higher if any constants and/or already bound variables in said corresponding arc-expression are incompatible with the then-current marking, (2) marking the arc-expression in the data structure if the arc-expression contains function applications which cannot yet be evaluated due to the presence of unbound variables, and (3) adding newly bound variables to a proposed binding, if the pattern match succeeds;
   g. means for checking each marked arc-expression in the data structure to determine if it is now evaluable and, if so, initiating operation of the means for determining whether there are any unbound variables in the nets until there are no more unbound variables or no more evaluable arc expressions;
   h. means responsive to the presence of no evaluable marked arc-expressions, for determining, for each still-unbound variable, whether the variable (a) only occurs in output arc-expressions or (b) occurs in input arc-expressions that are marked and remain unevaluable;
   i. means for generating, for each unevaluable input arc-expression in the data structure and for each variable thereof which is of a color set (i.e., type) with only a small number of values, a possible binding as if there had been a match, and for generating a possible value by a random selection if the variable is of a large color set; and
   j. means for evaluating arc functions using the thus generated binding.

* * * * *